United States Patent
Morio et al.

(10) Patent No.: US 8,712,740 B2
(45) Date of Patent: Apr. 29, 2014

(54) SIGNAL JUDGMENT METHOD, SIGNAL JUDGMENT APPARATUS, PROGRAM, AND SIGNAL JUDGMENT SYSTEM

(75) Inventors: Kenichi Morio, Tokyo (JP); Yoshio Tadahira, Tokyo (JP); Koichi Yamashita, Tokyo (JP); Shinji Ohashi, Tokyo (JP); Toshihito Matsui, Kyoto (JP)

(73) Assignee: Nittobo Acoustic Engineering Co., Ltd., Tokyo (JP)

( * ) Notice: Subject to any disclaimer, the term of this patent is extended or adjusted under 35 U.S.C. 154(b) by 585 days.

(21) Appl. No.: 12/992,382

(22) PCT Filed: May 14, 2008

(86) PCT No.: PCT/JP2008/058825
§ 371 (c)(1),
(2), (4) Date: Nov. 12, 2010

(87) PCT Pub. No.: WO2009/139052
PCT Pub. Date: Nov. 19, 2009

(65) Prior Publication Data
US 2011/0066411 A1    Mar. 17, 2011

(51) Int. Cl.
*G06F 7/60* (2006.01)
*G06F 17/10* (2006.01)
*G06F 17/50* (2006.01)

(52) U.S. Cl.
CPC .................................. *G06F 17/5018* (2013.01)
USPC ............................................................ 703/2

(58) Field of Classification Search
USPC ........................................................ 703/2, 6
See application file for complete search history.

(56) References Cited

FOREIGN PATENT DOCUMENTS

| JP | 2001-165763 A | 6/2001 |
| JP | 2004-287010 A | 10/2004 |
| JP | 2007-86703 A | 4/2007 |

OTHER PUBLICATIONS

Sooriyaarachchi et al., "Development of a Road Traffic Noise Prediction Model", Proceedings of the Technical Sessions, 22 (2006), p. 17-24.*
Alimohammadi et al. "Reliability Analysis of Traffic Noise Estimation in highways of Tehran by Monte Carlo Simulation Method", Iran. J. Environ. health. Sci. Eng., 2005, vol. 2, No. 4, pp. 229-236.*
Yamashita et al., "Ways and means to automatically measure aircraft noise in the fields", Noise Control, The Institute of Noise Control Engineering/ Japan, 2005, vol. 29, No. 5, pp. 363-367.

* cited by examiner

*Primary Examiner* — Eunhee Kim
(74) *Attorney, Agent, or Firm* — Birch, Stewart, Kolasch & Birch, LLP

(57) ABSTRACT

Provided is a high-accuracy signal judgment method for noise or vibrations of a living environment. Provided is a signal judgment method associated with noise or vibrations of a living environment. The signal judgment method includes: inputting, into a model equation of a to-be-measured/analyzed target, unknown data; and obtaining an output value as a probability value of whether the unknown data is a to-be-measured/analyzed target. The model equation of the to-be-measured/analyzed target is created with the use of measured already-known data. The model equation is created by prediction model equation calculation means. Incidentally, a logistic regression equation can be used as the prediction model equation.

19 Claims, 23 Drawing Sheets

Creation of prediction model and calculation of probability (Sample data, and
Sound-source-already-known data)
**Level waveform
Maximum noise level**

⇩
Calculation for ⇨
x1 to xn

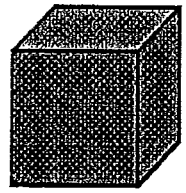

Creation of aircraft judgment prediction
model equation
(Calculation of coefficients a0 to an)

(Sample data, and
Sound-source unknown data)
**Level waveform
Maximum noise level**

⇩
Calculation ⇨
for x1 to xn

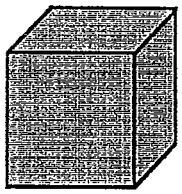

⇨ Prediction
probability
p(%)

Apply to aircraft judgment prediction model equation

FIG.3

FIG.10 Case in which greatest value is 65dB

| Classes | Variables | Substitution values |
|---|---|---|
| >=70dB | X3 | 0 |
| 66dB–70dB | X4 | 0 |
| 62dB–66dB | X5 | 1 |
| 58dB–62dB | X6 | 0 |
| 54dB–58dB | X7 | 0 |
| <54dB | | |

Dummy variables

FIG.12

Example of measurement/analysis results (example of prediction)

| Occurrence time | Noise value (dB) | Duration time (second) | Dark noise (dB) | Probability value | Sound source (judged by judgment member) |
|---|---|---|---|---|---|
| 10:47:01 | 64.6 | 65 | 44.5 | 81 | Aircraft noise |
| 11:14:32 | 58.1 | 33 | 45.5 | 72 | Aircraft noise |
| 11:16:34 | 58.3 | 17 | 45.1 | 84 | Aircraft noise |
| 11:21:02 | 66.9 | 44 | 46.6 | 31 | Vehicle |
| 11:23:20 | 60.6 | 36 | 46.8 | 52 | Aircraft noise |
| 11:28:27 | 73.8 | 39 | 47 | 1 | Working sound |
| 11:28:43 | 63.9 | 33 | 46.4 | 20 | Human voice |
| 12:00:26 | 89.0 | 31 | 50.5 | 0 | Disaster-prevent wireless system |
| 12:15:59 | 61.6 | 47 | 44.8 | 86 | Aircraft noise |
| 12:16:23 | 57.6 | 26 | 44.2 | 11 | Vehicle |
| 12:36:54 | 62.5 | 62 | 44.2 | 72 | Aircraft noise |
| 12:47:06 | 62.7 | 45 | 44.4 | 79 | Aircraft noise |
| 12:54:07 | 65.4 | 41 | 43.6 | 84 | Aircraft noise |
| 13:03:09 | 59.9 | 28 | 45.4 | 64 | Aircraft noise |
| 13:09:29 | 61.1 | 30 | 45.7 | 80 | Aircraft noise |
| 13:15:02 | 64.9 | 57 | 44.9 | 79 | Aircraft noise |
| 13:20:32 | 58.3 | 39 | 45.1 | 94 | Aircraft noise |
| 13:42:40 | 65.6 | 56 | 44 | 88 | Aircraft noise |
| 13:58:24 | 69.4 | 76 | 45 | 71 | Aircraft noise |
| 14:12:15 | 56.7 | 30 | 44 | 76 | Aircraft noise |

To network 5

FIG. 18

| Date | Occurrence time | Noise value | (Only data of noise level meter) Probability value (%) | (Radio-wave identification signal) Probability value (%) | Judgment by measurement member (O:Aircraft, x:Anything other than aircraft) | Sound source (judged by measurement member) |
|---|---|---|---|---|---|---|
| 2007/3/16 | 0:15:45 | 43.3 | 0.6 | 0.0 | x | Wind |
| 2007/3/16 | 0:16:55 | 43.3 | 0.5 | 0.0 | x | Wind |
| 2007/3/16 | 0:24:30 | 43.4 | 0.2 | 0.0 | x | Wind |
| 2007/3/16 | 0:24:56 | 43.3 | 0.1 | 0.0 | x | Wind |
| 2007/3/16 | 0:32:53 | 43.3 | 0.1 | 0.0 | x | Wind |
| 2007/3/16 | 1:23:31 | 45.6 | 0.0 | 0.0 | x | Motorbike |
| 2007/3/16 | 5:58:01 | 65 | 15.0 | 0.0 | x | Crow |
| 2007/3/16 | 6:22:39 | 55.9 | 0.0 | 0.0 | x | Ship |
| 2007/3/16 | 6:31:33 | 66 | 0.0 | 0.0 | x | Crow |
| 2007/3/16 | 6:33:10 | 65.8 | 0.0 | 0.0 | x | Crow |
| 2007/3/16 | 6:35:33 | 65.3 | 0.0 | 0.0 | x | Crow |
| 2007/3/16 | 6:45:04 | 67 | 73.6 | 80.1 | O | Aircraft noise |
| 2007/3/16 | 6:57:28 | 60.9 | 61.7 | 85.1 | O | Aircraft noise |
| 2007/3/16 | 7:05:38 | 55.7 | 0.5 | 0.0 | x | Vehicle |
| 2007/3/16 | 7:08:36 | 51.8 | 0.0 | 0.0 | x | Vehicle |
| 2007/3/16 | 7:23:09 | 62 | 88.3 | 94.4 | O | Aircraft noise |
| 2007/3/16 | 7:51:44 | 55.4 | 11.3 | 0.0 | x | Vehicle |
| 2007/3/16 | 8:21:19 | 61.5 | 5.2 | 30.6 | O | Aircraft noise |
| 2007/3/16 | 8:49:10 | 70.5 | 77.4 | 98.2 | O | Aircraft noise |
| 2007/3/16 | 8:50:38 | 55.7 | 16.7 | 0.0 | x | Working sound |
| 2007/3/16 | 8:55:17 | 59.8 | 54.0 | 0.0 | x | Working sound |
| 2007/3/16 | 9:16:09 | 68.3 | 0.0 | 0.0 | x | Crow |
| 2007/3/16 | 9:40:06 | 62.7 | 80.3 | 90.7 | O | Aircraft noise |
| 2007/3/16 | 9:58:27 | 66.0 | 0.0 | 0.0 | x | Crow |
| 2007/3/16 | 10:19:29 | 62.7 | 0.6 | 0.0 | x | Vehicle |
| 2007/3/16 | 10:19:57 | 53.6 | 0.3 | 0.0 | x | Noise of object |
| 2007/3/16 | 10:45:29 | 68.4 | 87.6 | 90.9 | O | Aircraft noise |
| 2007/3/16 | 11:00:12 | 66.9 | 85.0 | 88.4 | O | Aircraft noise |
| 2007/3/16 | 11:02:28 | 52.1 | 0.1 | 0.0 | x | Drop of water |
| 2007/3/16 | 11:10:06 | 66.6 | 64.5 | 88.4 | O | Aircraft noise |
| 2007/3/16 | 11:10:50 | 54.9 | 9.2 | 0.0 | x | Vehicle |
| 2007/3/16 | 11:18:19 | 63.3 | 89.4 | 94.9 | O | Aircraft noise |
| 2007/3/16 | 11:24:46 | 54.7 | 5.6 | 0.0 | x | Noise of object |
| 2007/3/16 | 11:25:30 | 63.6 | 79.7 | 90.4 | O | Aircraft noise |
| 2007/3/16 | 11:32:46 | 64 | 81.9 | 91.2 | O | Aircraft noise |
| 2007/3/16 | 11:37:04 | 51.5 | 0.5 | 0.0 | x | Drop of water |
| 2007/3/16 | 11:44:47 | 63.5 | 81.2 | 91.0 | O | Aircraft noise |
| 2007/3/16 | 11:56:04 | 60.5 | 0.0 | 0.0 | x | Small bird |
| 2007/3/16 | 12:00:26 | 88.6 | 0.0 | 82.6 | O | Disaster-prevent wireless system |
| 2007/3/16 | 12:23:10 | 61.9 | 57.4 | 62.3 | O | Aircraft noise |
| 2007/3/16 | 12:26:30 | 55.6 | 13.1 | 0.0 | x | Working sound |
| 2007/3/16 | 12:41:34 | 62.9 | 59.9 | 81.9 | O | Aircraft noise |
| 2007/3/16 | 12:42:05 | 55.8 | 0.0 | 0.0 | x | Noise of object |
| 2007/3/16 | 12:49:36 | 55.5 | 9.4 | 0.0 | x | Small bird |
| 2007/3/16 | 12:56:21 | 54.7 | 0.7 | 0.0 | x | Small bird |
| 2007/3/16 | 12:58:27 | 48.3 | 0.2 | 0.0 | x | Vehicle |
| 2007/3/16 | 13:01:31 | 51.4 | 0.2 | 13.9 | O | Drop of water |
| 2007/3/16 | 13:09:21 | 66.9 | 83.6 | 87.3 | O | Aircraft noise |
| 2007/3/16 | 13:10:18 | 55.4 | 0.9 | 0.0 | x | Vehicle |
| 2007/3/16 | 13:21:50 | 48.5 | 1.4 | 0.0 | x | Vehicle |
| 2007/3/16 | 13:31:59 | 69.4 | 81.8 | 86.1 | O | Aircraft noise |
| 2007/3/16 | 13:38:37 | 50.7 | 0.1 | 0.0 | x | Vehicle |
| 2007/3/16 | 13:48:35 | 51.4 | 0.3 | 0.0 | x | Vehicle |
| 2007/3/16 | 13:50:29 | 56.1 | 0.0 | 0.0 | x | Vehicle |
| 2007/3/16 | 13:53:50 | 50.7 | 0.0 | 0.0 | x | Small bird |
| 2007/3/16 | 14:00:57 | 51.8 | 0.0 | 0.0 | x | Working sound |
| 2007/3/16 | 14:13:42 | 63.1 | 0.0 | 0.0 | x | Vehicle |
| 2007/3/16 | 14:15:06 | 56 | 0.0 | 0.0 | x | Noise of object |
| 2007/3/16 | 14:15:25 | 64 | 0.0 | 0.0 | x | Noise of object |
| 2007/3/16 | 14:18:06 | 61.7 | 0.0 | 0.0 | x | Vehicle |
| 2007/3/16 | 14:25:27 | 66.5 | 78.2 | 83.1 | O | Aircraft noise |
| 2007/3/16 | 14:31:58 | 57.7 | 4.7 | 0.0 | x | Crow |
| 2007/3/16 | 14:40:57 | 62.8 | 79.1 | 90.4 | O | Aircraft noise |
| 2007/3/16 | 15:11:45 | 60.5 | 52.4 | 0.0 | x | Vehicle |
| 2007/3/16 | 15:12:56 | 53.1 | 0.2 | 0.0 | x | Working sound |
| 2007/3/16 | 15:14:13 | 62.8 | 77.7 | 89.2 | O | Aircraft noise |
| 2007/3/16 | 15:24:16 | 51.8 | 0.1 | 0.0 | x | Vehicle |
| 2007/3/16 | 15:26:28 | 60.2 | 57.1 | 82.4 | O | Aircraft noise |
| 2007/3/16 | 15:27:39 | 51.3 | 0.5 | 0.0 | x | Human voice |
| 2007/3/16 | 15:28:49 | 54.9 | 3.9 | 0.0 | x | Vehicle |
| 2007/3/16 | 15:39:16 | 54 | 0.0 | 0.0 | x | Vehicle |
| 2007/3/16 | 15:43:33 | 54.2 | 2.5 | 0.0 | x | Noise of object |
| 2007/3/16 | 15:44:30 | 52.5 | 0.9 | 0.0 | x | Human voice |
| 2007/3/16 | 15:45:50 | 55.5 | 9.9 | 0.0 | x | Vehicle |
| 2007/3/16 | 15:53:36 | 46.9 | 0.6 | 0.0 | x | Working sound |
| 2007/3/16 | 15:58:26 | 53.1 | 1.2 | 0.0 | x | Small bird |
| 2007/3/16 | 15:59:28 | 48.8 | 0.2 | 0.0 | x | Vehicle |
| 2007/3/16 | 16:00:29 | 61.7 | 51.4 | 79.7 | O | Small bird |
| 2007/3/16 | 16:06:05 | 59.9 | 69.8 | 88.8 | O | Aircraft noise |
| 2007/3/16 | 16:11:13 | 58.3 | 0.0 | 0.0 | x | Aircraft noise |
| 2007/3/16 | 16:14:55 | 50.9 | 0.0 | 0.0 | x | Vehicle |
| 2007/3/16 | 16:15:55 | 47.3 | 1.5 | 0.0 | x | Crow |
| 2007/3/16 | 16:17:43 | 63.9 | 76.4 | 90.4 | O | Vehicle |
| 2007/3/16 | 16:23:58 | 53.6 | 0.0 | 0.0 | x | Aircraft noise |
| 2007/3/16 | 16:24:33 | 51.9 | 0.0 | 0.0 | x | Small bird |
| 2007/3/16 | 16:33:15 | 71.5 | 75.8 | 87.4 | O | Vehicle |
| 2007/3/16 | 16:32:55 | 55.2 | 3.5 | 0.0 | x | Aircraft noise |
| 2007/3/16 | 16:35:35 | 66.8 | 70.7 | 81.0 | O | Vehicle |
| 2007/3/16 | 16:42:06 | 55.5 | 0.0 | 0.0 | x | Vehicle |
| 2007/3/16 | 16:42:32 | 62.8 | 0.0 | 0.0 | x | Vehicle |
| 2007/3/16 | 16:45:46 | 64.8 | 81.0 | 90.7 | O | Aircraft noise |
| 2007/3/16 | 16:47:27 | 61.5 | 59.3 | 83.8 | O | Aircraft noise |
| 2007/3/16 | 17:23:31 | 60.2 | 53.8 | 80.9 | O | Aircraft noise |
| 2007/3/16 | 17:39:54 | 63.9 | 79.3 | 89.8 | O | Aircraft noise |
| 2007/3/16 | 17:47:12 | 54.2 | 14.0 | 0.0 | x | Vehicle |
| 2007/3/16 | 17:48:56 | 60.5 | 29.1 | 57.6 | O | Aircraft noise |
| 2007/3/16 | 18:08:12 | 64.5 | 37.8 | 67.5 | O | Aircraft noise |
| 2007/3/16 | 18:14:20 | 47.6 | 0.0 | 94.2 | O | Wind |
| 2007/3/16 | 18:18:42 | 62.3 | 82.5 | 92.6 | O | Aircraft noise |
| 2007/3/16 | 18:33:03 | 48.1 | 0.3 | 0.0 | x | Wind |
| 2007/3/16 | 18:34:43 | 51.4 | 0.1 | 0.0 | x | Wind |
| 2007/3/16 | 18:34:54 | 46.6 | 0.0 | 0.0 | x | Wind |
| 2007/3/16 | 19:29:38 | 61.1 | 57.1 | 82.4 | O | Aircraft noise |
| 2007/3/16 | 19:36:34 | 62.5 | 43.4 | 71.9 | O | Aircraft noise |
| 2007/3/16 | 20:10:10 | 46.7 | 0.0 | 0.0 | x | Aircraft noise |
| 2007/3/16 | 21:00:14 | 63.1 | 73.2 | 86.9 | O | Aircraft noise |
| 2007/3/16 | 21:20:20 | 61.4 | 59.2 | 83.7 | O | Aircraft noise |
| 2007/3/16 | 21:45:49 | 44.5 | 0.0 | 0.0 | x | Human voice |
| 2007/3/16 | 22:20:58 | 48.6 | 0.0 | 0.0 | x | Wind |
| 2007/3/16 | 22:23:41 | 49.5 | 0.3 | 0.0 | x | Wind |
| 2007/3/16 | 22:29:13 | 48.4 | 0.6 | 0.0 | x | Drop of water |

Example of data that can be used in recognition (judgment as to whether data is a target)

[Remarks]
· Not all of the following items of data (information) may be used.

FIG.20A

○ Aircraft noise

| Data (information) | Explanation | Examples |
|---|---|---|
| Time-series noise data | Time-series data of noise values of a given section | (1) Instantaneous noise level values at intervals of n seconds (1 second, 0.1 second or the like)<br>Example 2: n-second LAeq-value at intervals of n seconds (as above)<br>Example 3: maximum noise level value at intervals of n seconds (as above) |
| Maximum noise level | The greatest value of the noise level of a given section | 83.5 dB<br>May be categorized (80 to 84dB and the like) |
| Maximum noise level occurrence time | | 12:35:48<br>May be categorized (between twelve and one o'clock, and the like) |
| Transponder response radio-wave electric-field strength level | | 73 (Normalized by 0 to 100) or a flag of whether the level exceeds a threshold value (1/0) |
| Airframe identification number | Included in transponder response signal radio-waves | 2338 (which can be classified into groups of domestic airline, international airline and the like) |
| Flight altitude | As above | 3600 feet |
| Takeoff / landing | A judgment is given whether an airplane is ascending or descending based on time-dependent changes of the flight altitude of a given section | Takeoff |
| Dark noise level | Preceding dark noise level (BGN) | 53.8 dB |
| One-off noise exposure level | The level of energy in a section where aircraft noise is dominant | 94.2 dB |
| Noise duration time | The time when the noise continuously exceeds a threshold value or maximum noise level of -10dB | 21 Second |
| Sound-source coming direction | The direction in which the noise approaches when the maximum noise level is recorded | Angle of direction : 35°<br>Angle of elevation : 28°<br>Only angle-of-elevation information may be used |
| Moving sound-source flag | Whether the noise is a sound of movement when the maximum noise level is recorded | 5°/Second (Angular velocity)<br>Or a flag of movement/stop |
| Frequency characteristics | The dominant frequency of the noise when the maximum noise level is recorded | 253 Hz |
| Time-series data of sound-source strength level | Sound-source strength or level thereof | 128 mag. |
| Time-series data of sound-pressure waveform | Raw waveform of sound pressure<br>the time-series data is not directly used in recognition. However, it is expected that a sound-source judgment is made with the use of an audio recognition method or the like based on the data and the results are used |  |
| Wind direction | | NNW |
| Wind speed | | 6.3 m/s (which may be categorized) |
| Temperature | | 23.5°C (which may be categorized) |
| Humidity | | 63% (which may be categorized) |
| Atmosphere pressure | | 1013hPa (which may be categorized) |

Example of data that can be used in recognition (judgment as to whether data is a target)

[Remarks]
· Not all of the following items of data (information) may be used.

FIG. 20B

○ Road traffic noise

| Data (information) | Explanation | Examples |
|---|---|---|
| Time-series noise data | Time-series data of noise values of a given section | (1) Instantaneous noise level values at intervals of n seconds (1 second, 0.1 second or the like)<br>Example 2: n-second LAeq-value at intervals of n seconds (as above)<br>Example 3: maximum noise level value at intervals of n seconds (as above) |
| Maximum noise level | The greatest value of the noise level of a given section | 83.5 dB<br>May be categorized (80 to 84dB and the like) |
| Maximum noise level occurrence time | | 12:35:48<br>May be categorized (between twelve and one o'clock, and the like) |
| Transit speed | | 43 km/h |
| Dark noise level | Preceding dark noise level (BGN) | 53.8 dB |
| One-off noise exposure level | The level of energy in a section where aircraft noise is dominant | 94.2 dB |
| Noise duration time | The time when the noise continuously exceeds a threshold value or maximum noise level of -10dB | 21 second |
| Sound-source coming direction | The direction in which the noise approaches when the maximum noise level is recorded | Angle of direction : 35°<br>Angle of elevation : 28°<br>Only angle-of-elevation information may be used |
| Moving sound-source flag | Whether the noise is a sound of movement when the maximum noise level is recorded | 5°/Second (Angular velocity)<br>Or a flag of movement / stop |
| Frequency characteristics | The dominant frequency of the noise when the maximum noise level is recorded | 253 Hz |
| Time-series data of sound-source strength level | Sound-source strength or level thereof | 128 mag. |
| Time-series data of sound-pressure waveform | Raw waveform of sound pressure<br>the time-series data is not directly used in recognition. However, it is expected that a sound-source judgment is made with the use of an audio recognition method or the like based on the data and the results are used |  |
| Wind direction | | NNW |
| Wind speed | | 6.3 m/s (which may be categorized) |
| Temperature | | 23.5°C (which may be categorized) |
| Humidity | | 63% (which may be categorized) |
| Atmosphere pressure | | 1013hPa (which may be categorized) |
| Road surface condition | | Dried / bad road |
| Weather | | Rainy weather |

○ Road traffic vibration
- "Noise" of the above road traffic noise is replaced with "vibration."
- A "vibration level meter" is used as a measuring instrument instead of a "noise level meter."

○ Example of data that can be used in recognition (judgment as to whether data is a target)

[Remarks]
· Not all of the following items of data (information) may be used.

FIG.20C

○ Railroad noise

| Data (information) | Explanation | Examples |
|---|---|---|
| Time-series noise data | Time-series data of noise values of a given section | (1) Instantaneous noise level values at intervals of n seconds (1 second, 0.1 second or the like)<br>Example 2: n-second LAeq-value at intervals of n seconds (as above)<br>Example 3: maximum noise level value at intervals of n seconds (as above) |
| Maximum noise level | The greatest value of the noise level of a given section | 83.5 dB<br>May be categorized (80 to 84dB and the like) |
| Maximum noise level occurrence time | | 12:35:48<br>May be categorized (between twelve and one o'clock, and the like) |
| Electric-field strength level | Electric-field strength level of train communication signal radio waves | 73 (Normalized by 0 to 100) or a flag of whether the level exceeds a threshold value (1/0) |
| Transit speed | | 235 km/h |
| Up / down | Which is overwhelming, the communication signal radio wave of an up train or that of a down train? | Up |
| Dark noise level | Preceding dark noise level (BGN) | 53.8 dB |
| One-off noise exposure level | The level of energy in a section where aircraft noise is dominant | 94.2 dB |
| Noise duration time | The time when the noise continuously exceeds a threshold value or maximum noise level of -10dB | 21 second |
| Sound-source coming direction | The direction in which the noise approaches when the maximum noise level is recorded | Angle of direction : 35°<br>Angle of elevation : 28°<br>Only angle-of-elevation information may be used |
| Moving sound-source flag | Whether the noise is a sound of movement when the maximum noise level is recorded | 12° /Second (Angular velocity)<br>Or a flag of movement/stop |
| Frequency characteristics | The dominant frequency of the noise when the maximum noise level is recorded | 253 Hz |
| Time-series data of sound-source strength level | Sound-source strength or level thereof | 128 mag. |
| Time-series data of sound-pressure waveform | Raw waveform of sound pressure<br>the time-series data is not directly used in recognition. However, it is expected that a sound-source judgment is made with the use of an audio recognition method or the like based on the data and the results are used |
| Wind direction | | NNW |
| Wind speed | | 6.3 m/s (which may be categorized) |
| Temperature | | 23.5°C (which may be categorized) |
| Humidity | | 63% (which may be categorized) |
| Atmosphere pressure | | 1013hPa (which may be categorized) |

○ Railroad vibration
- "Noise" of the above road traffic noise is replaced with "vibration."
- A "vibration level meter" is used as a measuring instrument instead of a "noise level meter."

Example of data that can be used in recognition (judgment as to whether data is a target)

[Remarks]
 · Not all of the following items of data (information) may be used.

FIG.20D

○ Office / construction noise and environmental noise

| Data (information) | Explanation | Examples |
|---|---|---|
| Time-series noise data | Time-series data of noise values of a given section | (1) Instantaneous noise level values at intervals of n seconds (1 second, 0.1 second or the like)<br>Example 2: n-second LAeq-value at intervals of n seconds (as above)<br>Example 3: maximum noise level value at intervals of n seconds (as above) |
| Maximum noise level | The greatest value of the noise level of a given section | 83.5 dB<br>May be categorized (80 to 84dB and the like) |
| Maximum noise level occurrence time | | 12:35:48<br>May be categorized (between twelve and one o'clock, and the like) |
| Dark noise level | Preceding dark noise level (BGN) | 53.8 dB |
| One-off noise exposure level | The level of energy in a section where aircraft noise is dominant | 94.2 dB |
| Noise duration time | The time when the noise continuously exceeds a threshold value or maximum noise level of -10dB | 21 second |
| Sound-source coming direction | The direction in which the noise approaches when the maximum noise level is recorded | Angle of direction : 35°<br>Angle of elevation : 28°<br>Only angle-of-elevation information may be used |
| Moving sound-source flag | Whether the noise is a sound of movement when the maximum noise level is recorded | 5°/Second (Angular velocity)<br>Or a flag of movement / stop |
| Frequency characteristics | The dominant frequency of the noise when the maximum noise level is recorded | 253 Hz |
| Time-series data of sound-source strength level | Sound-source strength or level thereof | 128 mag. |
| Time-series data of sound-pressure waveform | Raw waveform of sound pressure<br>the time-series data is not directly used in recognition. However, it is expected that a sound-source judgment is made with the use of an audio recognition method or the like based on the data and the results are used |
| Wind direction | | NNW |
| Wind speed | | 6.3 m/s (which may be categorized) |
| Temperature | | 23.5°C (which may be categorized) |
| Humidity | | 63% (which may be categorized) |
| Atmosphere pressure | | 1013hPa (which may be categorized) |
| Weather | | Rainy weather |

○ Office / construction vibration

- "Noise" of the above road traffic noise is replaced with "vibration."

- A "vibration level meter" is used as a measuring instrument instead of a "noise level meter."

SIGNAL JUDGMENT METHOD, SIGNAL JUDGMENT APPARATUS, PROGRAM, AND SIGNAL JUDGMENT SYSTEM

TECHNICAL FIELD

The present invention relates to a signal judgment method, a signal judgment apparatus, a program, and a signal judgment system and particularly to a signal judgment method, a signal judgment apparatus, a program, and a signal judgment system that judges a signal with high accuracy with the use of time-series data of the signal and a maximum signal strength.

BACKGROUND ART

Noise is a noisy, unpleasant sound. In particular, the noise of an airplane or car running on a highway often causes environmental problems.

Noise is actually defined as environmental pollution under the Environmental Basic Act and environmental quality standards are also in place (Environmental Basic Act (Law No. 91, 1993) Environmental Quality Standards for Noise under the provisions of paragraph 1 of Article 16).

In order to address noise, it is necessary to accurately measure and analyze noise. It is also extremely important to secure the accuracy and reliability of measured/analyzed values.

However, the noise to be measured varies in terms of time or space. Therefore, it is difficult to obtain an accurate measured value of the noise for a short period of time.

Accordingly, in order to address noise, it is desirable that the measurement of noise go on for a long time/long period of time and that the noise be analyzed based on the measured data.

When noise is actually measured, the best way is manned measurement: a skilled measurement member who has long experience in measurement techniques is permanently stationed in the fields and carries out measurement while grasping the situation. However, when the measurement continues for a long time/long period of time, the problems is the costs and burden of the measurement member.

Therefore, when the measurement of noise goes on for a long time/long period of time, automatic measurement is often used instead of a measurement member being permanently stationed in the fields: a measurement device is disposed to automatically measure.

As a conventional system of such an automatic measurement type, for example, there is a noise measurement management system that automatically measures noise levels and records actual sound as well as analyzes acquired noise data and easily reproduces the actual sound as disclosed in PTL 1 (which is referred to as Conventional Technique 1, hereinafter).

The noise measurement management system of Conventional Technique 1 is equipped with a function of measuring a noise level from audio input signals, a function of analyzing and storing noise level data, a function of displaying and printing a chart diagram of noise levels, and a function of recording actual sound whose noise level is greater than or equal to a predetermined threshold value. Thanks to such functions, it is possible to carry out automatic measurement.

In measuring noise, it is important to recognize (judge) whether the detected audio input signals are those to be measured.

In the case of the manned measurement where an experienced measurement member manually carries out measurement, this recognition is easy.

However, in the case of the automatic noise measurement, the recognition is difficult. Accordingly, it is necessary for a measurement member to manually adjust a recognition condition with the use of some artificial recognition condition.

In the noise measurement management system of Conventional Technique 1, typical dark noise (background noise) is simply separated from noise, and a certain constant dark noise level is set as a threshold value. The noise measurement management system is so configured as to judge noise (noise judgment) when an input audio signal is greater than the threshold value and store the noise.

According to Conventional Technique 1, a measurement member sets the dark noise level as a recognition condition.

In such a case where only the dark noise level is used as a recognition condition, the problem is that the reliability of a measured value is lowered.

As the one that uses an advanced noise recognition condition, what is disclosed in NPL 1 is a noise measurement method of setting the following condition as a recognition condition (which is referred to as Conventional Technique 2, hereinafter): a case where the frequency band of an input audio signal has a characteristic or a case where radio waves emanating from an airplane and noise are detected at the same time.

When the noise judgment method of Conventional Technique 2 is used, it does not take much time and effort to sort out data because the data to be acquired can be whittled down more than a process of simply acquiring all the data that is greater than or equal to a threshold value.

PTL 1: JP-A-2001-165763

NPL 1: Yamashita, Oohashi, "Ways and means to automatically measure aircraft noise in the fields," Noise Control, The Institute of Noise Control Engineering/Japan, 2005, Vol. 29, No. 5, p. 363-367

SUMMARY OF INVENTION

Technical Problem

However, according to the noise measurement management system of Conventional Technique 1, the noise level is simply compared with the threshold value. If there are many noises that are different from the to-be-measured/analyzed noise, the problem is that the noise measurement management system acquires all the noises. That is, the noise measurement management system may accept data other than the to-be-measured/analyzed data. If the threshold value is raised to address the above problem, the noise measurement management system, on the contrary, may lose some data. As a result, it takes extra time and efforts in the process of sorting out data. There is also a fear that the reliability of a measured value could be damaged.

According to the noise measurement method of Conventional Technique 2, since the noise environment varies from measurement spot to measurement spot, it is necessary for a measurement member to set a recognition condition for noise judgment. However, the problem with the setting of the recognition condition is that it is necessary to take a long period of time to make adjustments in the fields. Another problem is that a mistake is often made in recognizing noise in the case where the to-be-measured/analyzed noise and other noises are simultaneously observed or where the difference between the noise and the dark noise is small.

The present invention has been made in view of the above circumstances. The object of the present invention is to solve the above problems.

Solution to Problem

According to the present invention, a signal judgment method is a noise judgment method of determining a to-be-measured/analyzed target by a computer including: inputting, into a model of a to-be-measured/analyzed target associated with noise or vibrations, unknown data that is so called because whether the unknown data is a to-be-measured/analyzed target is unknown; and obtaining an output value of the model of the to-be-measured/analyzed target as a probability value of whether the unknown data is a to-be-measured/analyzed target.

According to the signal judgment method of the present invention, the model of the to-be-measured/analyzed target is created with the use of measured already-known data.

According to the signal judgment method of the present invention, the model of the to-be-measured/analyzed target is created by prediction model equation calculation means with the use of the measured already-known data; unknown data is input into the created model of the to-be-measured/analyzed target associated with noise or vibrations; and an output value calculated by output value calculation means that uses the model of the to-be-measured/analyzed target is obtained as a probability value of whether the unknown data is a to-be-measured/analyzed target.

According to the signal judgment method of the present invention, the to-be-measured/analyzed target is a model of a to-be-measured/analyzed target that uses data concerning noise or vibrations of a living environment.

According to the signal judgment method of the present invention, a logistic regression equation is used for a prediction model equation associated with the model of the to-be-measured/analyzed target; the logistic regression equation uses a prediction factor associated with the model of the to-be-measured/analyzed target as an explanatory variable; the logistic regression equation uses the fact of whether the unknown data is the to-be-measured/analyzed target as an objective variable; and a probability value is calculated by adapting and inputting the unknown data to the logistic regression equation.

According to the signal judgment method of the present invention, some of the explanatory variables are adapted to prediction model equation after being classified into categories.

According to the signal judgment method of the present invention, the adaptation to the prediction model equation is made with the use of the degree of similarity between a plurality of items of the unknown data and sample data of a signal that becomes a to-be-measured/analyzed target, and a probability value is calculated.

According to the signal judgment method of the present invention, the adaptation to the prediction model equation is made with the use of the degree of dissimilarity between a plurality of items of the unknown data and sample data of a signal that is not a to-be-measured/analyzed target, and a probability value is calculated.

According to the signal judgment method of the present invention, data of a type that has a large impact on a prediction model equation of the to-be-measured/analyzed target is used as sample data of a signal that is not a to-be-measured/analyzed target.

According to the signal judgment method of the present invention, the sample data is created with the use of a statistical method from sampled time-series data of a predetermined period of time.

According to the signal judgment method of the present invention, a model equation of a to-be-measured/analyzed target is created by calculating a coefficient of an explanatory variable of the logistic regression equation with the use of measured already-known data.

According to the signal judgment method of the present invention, a process of carrying out a test of a prediction model equation of the prediction model or explanatory variable and a process of carrying out an examination or test of validity are further performed.

According to the signal judgment method of the present invention, the already-known data is accumulated, and the prediction model equation is created again on the basis of the accumulated data.

According to the signal judgment method of the present invention, a plurality of to-be-measured/analyzed targets is changed, the unknown data is applied to the prediction model equation for the changed to-be-measured/analyzed target, and a probability value of whether the unknown data is the changed to-be-measured/analyzed target is obtained.

According to the signal judgment method of the present invention, a plurality of the models is provided, and, if one portion of data is not acquired, a model that does not apply the data is used among a plurality of the models.

A program executes the signal judgment method of the present invention.

According to the present invention, a signal judgment apparatus includes: storage means for storing a prediction equation of a model of a to-be-measured/analyzed target associated with noise or vibrations, already-known data, unknown data, sample data of a signal that is to be judged, and sample data of a signal that is not to be judged; prediction model equation calculation means for creating a prediction model equation by calculating a coefficient of an explanatory variable with the use of the degree of similarity or dissimilarity between the already-known data and sample data of a signal that becomes a to-be-measured/analyzed target and/or sample data of a signal that is not a to-be-measured/analyzed target; input means for inputting an input value to the storage means; output value calculation means for applying and calculating each value of the unknown data to the prediction model equation of a model of the to-be-measured/analyzed target; output means for outputting the output value; and judgment means for measuring and/or analyzing the type of the unknown data with the use of the output value.

In the signal judgment apparatus of the present invention, the storage means is storage means in which a plurality of the prediction model equations is stored when the explanatory variable is added; the signal judgment apparatus further includes data integration means for integrating output values of a plurality of the prediction model equations; and the output value calculation means applies data concerning the explanatory variable to a plurality of the prediction model equations with the use of the data integration means for calculation.

According to the present invention, a signal judgment system includes: the signal judgment apparatus; and a sensor that transmits the unknown data to the input means.

Advantageous Effects of Invention

According to the present invention, it is possible to provide a signal judgment method that makes it unnecessary for a measurement member to manually adjust a recognition condition and offers a highly reliable measured value by stochastically expressing the results of recognition with a model of a to-be-measured/analyzed target.

DESCRIPTION OF EMBODIMENTS

<First Embodiment>
(System Configuration)

With reference to FIG. 1, the configuration of a noise judgment system X of an embodiment of the present invention will be described.

In the noise judgment system X of the embodiment of the present invention, sensors 200-1 to 200-n, which are acoustic sensors for noise, are connected to a server 100 (signal judgment apparatus), which actually judges noise, via a network 5, which is the Internet, an intranet or the like.

Specifically, a LAN, power-line LAN, cLink, wireless LAN, cellular phone or PHS network, wire telecommunication network, a dedicated line or the like may be used for the network 5. Moreover, the following forms of network can be used: an IP network, other types of star or ring networks, and the like. Data can be exchanged through storage media, such as a flexible disk, various flash memory cards, and a HDD (hard disk drive).

The server 100 is a PC server that uses a PC/AT compatible machine for data centers, a general-purpose machine, or the like. The server 100 executes a program for analyzing the sound pressure data of noise from the sensors 200-1 to 200-n to judge the type of the noise.

The sensors 200-1 to 200-n consist of main units of noise level meters equipped with all-weather microphones on which mounted are all-weather windbreak screens, microphone extension cables, and A/D converters; data communication units equipped with various interfaces; and the like. The data communication unit is equipped with a connection means for connecting to the network 5 such as a LAN interface.

The sensors 200-1 to 200-n are different from a noise level meter of Conventional Technique 1. The sensors 200-1 to 200-n measure signals, such as the sound pressure of the noise measured by the microphones, at intervals of a millisecond and can transmit data of the time-dependent (time-series) changes of the signals almost in real time using the LAN interface or the like. The waveform of the real sound (actual sound) is digitally sampled so as to be, for example, 16-bit CD-quality sounds (with a sampling frequency of 44.1 kHz). The sensors 200-1 to 200-n record the sampled actual sound and can transmit the recorded actual sound listen-in data in a similar way (The actual sound listen-in data may be compressed by MP3, AAC and other codecs according to circumstances before being transmitted).

Incidentally, the data is to be transmitted in line with the form of the above network 5.

(Control Configuration)

The following provides a more detailed description of the control configuration of the server 100 according to the embodiment of the present invention, with reference to FIG. 2.

The server 100 is a building block capable of analyzing and calculating noise data. The server 100 is primarily equipped with an input unit 100 (input means) to which data from each of the sensors 200-1 to 200-n is input; a storage unit 120 (storage means) that stores input data, prediction model equations, prediction results and the like; a prediction model equation calculation unit 130 (prediction model calculation means) that includes an arithmetic unit or the like for calculating a prediction model equation (model); a probability value calculation unit 140 (output value calculation means) that includes a arithmetic unit or the like for calculating a probability value (output value); a control unit 150 (judgment means) that is a CPU (Central Processing Unit), MPU (Micro Processing Unit) or the like; and an output unit 160 (output means) that is a LCD display, printer, plotter, waveform output device or the like.

More specifically, the input unit 110 is a LAN interface or the like. The input unit 110 includes such input means as a keyboard, pointing device, and optical/magnetic scanner. Therefore, the input unit 110 enables data from the sensors 200-1 to 200-n, data measured in advance by a measurement member and the like to be input. Also provided is a user interface that allows a measurement member to input the type of noise or the like concerning the input data of the sensors 200-1 to 200-n.

The storage unit 120 is a RAM, ROM, flash memory, HDD or the like. The storage unit 120 has a data-logger function. The storage unit 120 can store data of noise signals input from the sensors 200-1 to 200-n, data of noise signals measured in advance by a measurement member, (coefficients of) a prediction model equation, the results of judgment of noise, a noise judgment program, and other required data.

For the prediction model equation calculation unit 130 and the probability value calculation unit 140, such an arithmetic unit as a DSP (Digital Signal Processor) used exclusively for calculation, an arithmetic unit used exclusively for physics calculation, or a GPU (Graphics Processing Unit), which can calculate in real time, is preferably used. Incidentally, the functions of the prediction model equation calculation unit 130 and the probability value calculation unit 140 may be realized with the use of the calculation function of the control unit 150.

The control unit 150 is a building block that carries out control and calculation when a noise judgment process described below is actually performed. To this end, the control unit 150 performs various control and calculation processes in accordance with programs stored in the ROM, HDD or the like of the storage unit 120.

(Flow of Noise Judgment Process)

The following describes the creation of a prediction model and the calculation of a probability for determining noise according to the embodiment of the present invention, with reference to a conceptual diagram of FIG. 3.

As described above, in the process of automatic noise measurement of Conventional Technique 1, a threshold value of dark noise levels is set; it is judged that data of the sounds greater than or equal to the threshold value of dark noise levels is all noise, and the data is acquired. Therefore, it is necessary for a measurement member to listen to all the noises stored and distinguish the to-be-measured/analyzed noises from other noises. Therefore, a lot of time and effort is particularly required to do such things as analyzing on the sides of a highway where there are many noises of a living environment, for example, in the case of a airplane that is to be measured/analyzed.

Moreover, according to the noise judgment method of Conventional Technique 2, the problem is that the settings of recognition need to be done by a measurement member who therefore stays in the fields for a long period of time while making adjustments. Another problem is that depending on the environments where measurement takes place, it may take a lot of time because it may be necessary for a measurement member to eventually confirm whether a mistake is made in recognition.

As a result of earnestly researching and experimenting on a method of analyzing a sound pressure signal of noise using hardware resources of a calculator, the inventor of the present invention comes up with a signal judgment method, a signal judgment apparatus and a signal judgment system that are able to accurately recognize the type of noise and to dramatically reduce the time and effort required to examine the result of recognition by calculating with the use of data of time-dependent changes (unknown data, already-known data or sample data) of the magnitude (sound pressure and intensity) of the A/D converted noise and expressing the result of recognition of the noise (the result that the noise is identified as the to-be-measured/analyzed target or not) in the form of probabilities.

The use of the signal judgment method, the signal judgment apparatus and the signal judgment system enables noise to be stored as to-be-measured signals without a measurement member who stays in the fields for a long period of time to adjust a noise recognition condition.

Moreover, the signal judgment method, the signal judgment apparatus and the signal judgment system makes a noise judgment for noise associated with a prediction model to be measured or analyzed. Therefore, it is easy to distinguish the to-be-measured/analyzed noise from other noise, thereby making it possible to improve the accuracy of the automatic measurement. Even for vibrations, a signal judgment can be made in a similar way to the noise judgment with the use of data.

In the noise judgment system X of the first embodiment of the present invention, as for the recognition of the type of the noise, a noise judgment is made with the use of a probability value resulting from statistical analysis (or an output value associated with artificial intelligence or the like).

Incidentally, used for the data of the embodiment of the present invention, including the unknown data, the already known data and the sample data, is physical data that is input into the hardware resources of the calculator and stored electrically, magnetically or optically, not simple numerical data.

Here, a specific process of the noise judgment by the noise judgment system X will be described.

In the noise judgment system X of the embodiment of the present invention, data of noise signals detected by many sensors 200-1 to 200-n is first stored in the storage unit 120 of the server 100.

Then, recorded data measured by a measurement member who is permanently stationed in the fields maybe stored in the storage unit 120 as data of signals of materials for creating the sample data described below.

With the use of the data of the above signals, time-series data is first to be produced.

[Data Used for Noise Judgment]

The time-series data used in the noise judgment of the embodiment of the present invention is data of time-dependent changes of the strength of signals during a predetermined period of time (a given time range).

For the above data of signal changes, the time-series data of the strength of signals may be used, given the time-dependent changes of the strength of signals (noise). That is, the strength of the signals (the physical quantities of quantized signals) is acquired (sampled) at predetermined intervals, and the acquired data is used.

Specifically, for the signals, the waveforms of sound pressure level (the waveforms of sound pressure or noise level) maybe used. The following are examples of the sound pressure level waveforms:

(a) the sound pressure level waveforms during a predetermined period of time to be measured or analyzed (b) the sound pressure level waveforms during a predetermined period of time when the sound pressure level exceeds a predetermined threshold value (c) the sound pressure level waveforms during half a predetermined period of time, with the first and the second half separated by an observed maximum value The time-series data of such signals can be used.

In order to classify frequency bands into several groups using FFT or the like or to do other processes, data of sound pressure changes of some of predetermined frequency bands may also be used. In this case, a unique frequency band is selected for each noise, and data, such as those described in the above (a) to (c), can be used.

In the case of (b), for noise data, for example, under "Environmental Quality Standards for Aircraft Noise," the noise data that does not surpass (exceed) dark noise by 10 dB or more is not among those to be measured or analyzed. After being narrowed down based on such a condition, data may be prepared.

The predetermined period of time of the above (a) can be for example about 40 seconds; the data that is sampled at intervals of 1 second (the signal strength of which is measured by A/D conversion) can be used.

That is, in the case of the above (a), for example, 40-second data can be used from the data of the strength of signals stored continuously in the storage unit 120.

In the case of (b), for example, for the 40-second signal strength data following a portion where the sound pressure level exceeds a predetermined threshold, data that is sampled at intervals of 1 second or the like can be similarly used.

In the case of (c), for example, for a period 20 seconds before or after the maximum value, data that is sampled at intervals of 1 second or the like can be similarly used.

Incidentally, for example, when the sampling of signals is conducted at intervals of 1 second, the 20-second point is the center of the predetermined period of time if the predetermined of period of time is 40 seconds. Therefore, 41 items of data are used in total: 20 items of data that emerge before the center (from 0-second point to 19-second point) and 20 items of data that emerge after the center (from 21-second point to 40-second point).

Incidentally, in addition to the method of simply acquiring a sound pressure level when the sampling is performed, the ways to sample the sound pressure level waveforms include various methods, such as a method of acquiring an integrated value, a greatest value and an average value during a sampling interval. The sampling intervals may not be 1 second but several hundred milliseconds, or several seconds or greater.

For a way of acquiring data of a threshold value exceeding a dark noise level, a method of changing the threshold value in such a way that the percentile noise level of the sound pressure during the preceding certain period of time is 90% ($L_{90}$) to acquire the one greater than or equal to the threshold value may be used. Therefore, it is possible to distinguish dark noise (background noise) from noise.

In the noise judgment system X of the embodiment of the present invention, the above time-series data is mainly divided into the following three types before being used:

"Sample data": The sample data is data like a "model," which is to be compared with the other time-series data in order for the characteristic thereof to be calculated in the form of a difference or the like. For example, a group of sample data is created from characteristic data for each specific event, such as aircraft noise or noise other than those of aircraft; the group of sample data can be used in creating a prediction model equation. Moreover, a characteristic of unknown time-series data can be calculated in the form of a difference or the like with the use of the sample data.

A preferred number of sample data items may be used according to the sample size or a degree-of-similarity calculation method. According to the embodiment of the present invention, for example, the number of sample data items prepared is about 3 to 10.

[Sound-source Already-known Data] (Already Known Data):

The sound-source already-known data is time-series data (which is data the sound source's type of which has been identified thanks to manned measurement or the listening of actual sound) of the strength of a measured signal whose analysis zone is cut out in order to create a prediction model equation. Many items of sound-source already-known data need to be prepared for creating the prediction model equation.

[Sound-source Unknown Data] (Unknown Data):

The sound-source unknown data is unknown time-series data for identifying the type of noise. That is, the sound-source unknown data is time-series data whose probability of being to-be-measured/analyzed noise is to be calculated.

Moreover, in the noise judgment system X of the embodiment of the present invention, the greatest value or maximum value of a signal, i.e. the maximum noise level in the cases of the above (a), (b) and (c), can also be used as data on which a focus is put in the noise judgment. The greatest and maximum values can be calculated from the sample data, the sound-source already-known data, and the sound-source unknown data.

Other data can also be used for a model when needed.

[Creation of Prediction Model Equation and Calculation of Probability Value]

With reference to a conceptual diagram of FIG. 3, what is described is an example in which logistic regression analysis, a type of statistical method, is used in creating a prediction model equation of a to-be-measured/analyzed.

In the example of FIG. 3, a prediction model equation of aircraft noise is first created with the use of time-series data of aircraft noise.

Then, unknown time-series data is put into the prediction model equation of the aircraft noise to judge noise.

According to the embodiment of the present invention, for example, all the following noises or vibrations, which are associated with a living environment, can be measured or analyzed: aircraft noise, road/traffic noise, railroad noise, business-office noise, factory noise, karaoke noise, loudspeaker/loudspeaker-van noise, road/traffic vibrations, railroad vibrations, and the like.

In the noise judgment system X of the embodiment of the present invention, with the use of the sample data and the sound-source already-known data, each part of the server 100 works together to create (derive) a prediction model equation.

Then, the sound-source unknown data whose noise type has not been identified (the time-series data whose sound source is unknown) is put into the created prediction model equation to calculate a probability value (p), which is a prediction probability.

The output of the probability value is examined, thereby making it possible to carry out the final noise judgment.

For example, the probability value is compared with threshold values A and B, which are used for the judgment of a predetermined probability value. When the probability value is greater than or equal to the threshold value A (greater than or equal to 70%, for example), it is judged that the noise is an aircraft noise. When the probability value is less than or equal to the threshold value B (less than or equal to 30%, for example), it is judged that the noise is not an aircraft noise. In any other cases (when the probability value is between A and B), it is judged that it is not possible to judge clearly; a warning is issued that checking should be carried out with the use of the actual sound listen-in data and the like.

[Logistic Regression Analysis]

In the embodiment of the present invention, the noise judgment process that uses logistic regression analysis will be mainly described.

Logistic regression analysis is a statistical method that makes a model of binary response data (variables), such as a particular event that "occurs" or "does not occur," with the use of a plurality of data items (variables) that can be factors in triggering the event.

A variable that is the objective of modeling, such as a to-be-measured/analyzed target that "occurs" or "does not occur," is called a response variable. A variable used in explaining a relevance to the response variable, such as a prediction factor, is called an explanatory variable.

A variable that is the objective of modeling, such as a to-be-measured/analyzed target that "occurs" or "does not occur," is called an response variable. A variable used in explaining a relevance to the response variable, such as a prediction factor, is called an explanatory variable.

When the probability of "success" is represented by p and each prediction factor by xi, a logistic regression equation is expressed as in the following equation (1).

Here, ai is a constant.

[Equation 1]

$$\log\frac{p}{1-p} = a_0 + a_1 x_1 + a_2 x_2 + a_3 x_3 + \ldots + a_n x_n \qquad \text{Equation (1)}$$

In the case of the modeling of the noise judgment, the response variable is used for whether the noise is a to-be-measured/analyzed target. That is, in the case of a model of aircraft noise, the following are used: "the noise is an aircraft noise" and "the noise is not an aircraft noise."

For the explanatory variable, in the case of a model of aircraft noise, for example, the following are used: a degree of similarity (a to-be-measured/analyzed target and anything other than the to-be-measured/analyzed target) to the sample data of noise waveforms, a maximum noise level, the position information of an airplane (the position information of a noise source), and the like. Other kinds of information may be added as explanatory variables when necessary and used after the validity of the prediction model is checked.

After the prediction model is thus created, it is possible to estimate the probability that the target noise is an aircraft noise.

Incidentally, as for the above explanatory variable, it is possible to make a sufficiently precise model only with the degree of similarity to the sample data of noise waveforms of the to-be-measured/analyzed target. However, when the model is created with other kinds of information added, it is possible to improve the accuracy.

(Flow of Prediction Model Creation Process)

The following describes a prediction model creation process that uses for example logistic regression analysis, with reference to FIG. 4.

The prediction model creation process mainly includes a sample data creation process and a process of calculating constant terms of a prediction model equation using the sample data and many items of sound-source already-known data.

(Step S101)

At step S101, the control unit 150 performs a sample data group creation process.

In the sample data group creation process, a group of sample data is created from time-series data whose sound source (type of noise) has been identified from data of noise measured in advance by a measurement member.

Specifically, for example, characteristic noise waveforms for a particular event, such as aircraft noise or noise other than those of aircraft, are calculated and regarded as a group of sample data.

Hereinafter, the creation of a group of sample data of aircraft noise will be described as an example. However, any kinds of time-series data can be used as long as the time-series data is signal data that can be classified as a particular event (to-be-measured/analyzed target) after the signal is recognized.

In the creation of the sample data, for example, a statistical method, such as cluster analysis or other clustering methods, can be used to create the sample data.

Here, with reference to FIG. 5, a more detailed process of the sample data group creation process of step S101 will be described as steps S1011 to S1016.

(Step S1011)

At step S1011, the control unit 150 performs a time-series data acquisition process of the to-be-measured/analyzed target.

Specifically, the control unit 150 cuts a data item of a predetermined period of time (40 seconds, for example) out of the recorded or material data stored in the storage unit 120.

As for the cut-out data, a measurement member uses in advance the one identified as a to-be-measured/analyzed target (aircraft noise data, for example) used to create a statistical model. That is, from the data of noise level waveforms of time-dependent changes of noise measured by a measurement member, characteristic data is cut out and acquired for each to-be-measured/analyzed target for a group of sample data.

In the cut-out process, in the range of characteristic data, for example, the data can be cut out after the phases of the waveforms are aligned. One example of aligning the phases is to cut out the data in such a way that the greatest value of the signal comes to the center of the predetermined period of time.

Incidentally, for example, as described below, when a prediction model equation that uses signal data of electric field strength as time-series data is used, a waveform having two peaks is obtained. In such a case, the data can be cut out in such a way that the centers of the peaks are aligned.

(Step S1012)

At step S1012, the control unit 150 performs a normalization process with the use of the maximum signal strength of the time-series data concerning the to-be-measured/analyzed target.

Specifically, each item in a group of time-series data (aircraft noise data) of the cut-out signal strength is normalized.

That is, each of the signals sampled in the time-series data is divided by the maximum strength of the signals of the time-series data so as to fall within the range of 0 to 1. In the example here, each of the signals is divided by each maximum noise level ($L_{Asmax}$, maximum noise value).

The normalization is performed for each item of time-series data.

(Step S1013)

At step S1013, the control unit 150 performs an aircraft noise cluster analysis process.

With reference to FIG. 6, the cluster analysis process will be described.

First, a group of the above time-series data can be regarded as a vector (data set) having 41 factors (from 0 second to 40 seconds) for each item of noise time-series data. That is, the magnitude of the signal strength of each second can be regarded as a factor of the vector.

In terms of the degree of similarity, the above vectors are classified to find out a vector that is characteristic of aircraft noise. The vector is used as sample data.

In an example of the cluster analysis process, cluster analysis is conducted in the creation of sample data.

At this time, on the basis of the degree of similarity between time-series data items of given noise waveforms, the data items having the highest degree of similarity are successively combined to make a cluster.

On the basis of the degree of similarity between clusters, the combination between the clusters is repeated until the clusters are combined into one cluster. Therefore, a hierarchical structure is obtained. Thus, as for each item of time-series data, items can be collected and classified into a group of similar items (clusters).

The degree of similarity is based on the squared Euclidean distance between vectors. For the clustering method, the Ward's method is used: according to the Ward's method, it is easy for clusters to condense and it is difficult for the hierarchical structure to be a chain structure.

Therefore, the time-series data items can be classified into groups of similar noise waveforms.

It is preferable that among the classified clusters, the sample data be selected from the maximum cluster.

Incidentally, in the above example of cluster analysis, a hierarchical clustering method is used. However, any statistical methods can be used to classify the time-series data items depending on circumstances.

In particular, for the clustering method, a non-hierarchical clustering method such as k-means method can be used. Other various hierarchical clustering methods (the shortest distance method, most parsimony method, neighbor-joining method and the like) can be used.

The method using cluster analysis has been described as one example. However, another statistical method may be used in analyzing data for sample data.

The above vectors may include data other than the time-series data as long as the data is an indicator that is characteristic of aircraft noise.

In the cluster analysis process, the time-series data that is classified into a decimal cluster (which is less than 10% of the total, for example) among the whole (the number of time-series data items, which is for example 5) may be regarded as a "failure" data (statistical failure data). Then, a process of removing the time-series data from a group of sample data (a process of not counting the time-series data among output values) may be performed.

Moreover, in the case where the clustering method used is capable of calculating the distance between clusters, if a plurality of large clusters (which is for example 30% or more of the total) is created and the distance between the large clusters is larger than a predetermined value, a warning that dividing the to-be-measured/analyzed target further is effective in creating a statistical model (for example, in the case of aircraft noise, the noise from a jumbo jet and those from a copter and the like) may be printed or displayed on the output unit 160.

Incidentally, the above degree of similarity between data items can be calculated by the most appropriate method depending on the type of data used. For example, such values as the square of a difference between signals or the square mean may be preferably used because the difference emerges more clearly.

What is shown in FIG. 7 is an example of sample data items 11 to 15 of aircraft noise calculated based on five clusters obtained by cluster analysis after, with the use of the material data obtained by measuring aircraft noise as a target, the normalization process is performed.

The vertical axis of the graph represents signal strength (with the greatest value of 1); the horizontal axis represents time (for a predetermined period of time). In this manner, an exemplary group of time-series data that is cut out during the predetermined period of time and associated with aircraft noise is used as sample data.

Incidentally, in the process of creating the group of sample data, the cluster analysis is performed to group those having similar characteristics for each sound source after already-known data items are classified according to sound sources.

That is, in creating sample data, the cluster analysis is just one of several methods. Another grouping method may be used to create a group of sample data.

(Step S1014)

At step S1014, the control unit 150 performs a process of acquiring time-series data other than a to-be-measured/analyzed target.

Specifically, in a similar way to step S1011, the control unit 150 cuts out data of a predetermined period of time other than the to-be-measured/analyzed target (aircraft noise, for example) from the recorded or material data stored in the storage unit 120.

The data "other than aircraft noise" is identified in advance by a measurement member as noise other than those of aircraft (such as noise of cars or trains, sound of a disaster-prevention wireless system, sound of frogs and the like). In addition, it is preferable that all of those having a large effect on an evaluation amount be selected if the data is mistakenly determined to be aircraft noise.

Incidentally, the application of the time-series data other than the to-be-measured/analyzed target to the prediction model equation is intended to improve the accuracy and not necessarily required.

(Step S1015)

At step S1015, the control unit 150 performs a normalization process with the use of the maximum signal strength of the time-series data other than the to-be-measured/analyzed target.

The process is performed in a similar way to step S1012. What is shown in FIG. 8 is an example of 6 sample data items 21 to 26 other than aircraft noise selected by cluster analysis after, with the use of the material data obtained by measuring noise other than those of aircraft as a target, the normalization process is performed. Even in the graph of FIG. 8, the vertical axis represents signal strength (with the greatest value of 1); the horizontal axis represents time.

(Step S1016)

At step S1016, the control unit 150 performs a cluster analysis process for those other than aircraft noise.

In a similar way to step S1013, in the cluster analysis process, a hierarchical or non-hierarchical clustering method is used for analysis.

In addition, at step S1016, when a large cluster (into which 30% or more of all the time-series data items are for example classified) is made, a warning can be printed or displayed on the output unit 160.

The above ends the sample data group processing creation.

(Step S102)

Here, returning to FIG. 4, at step S102, the prediction model equation calculation unit 130 of the server 100 performs a prediction model equation creation process.

Specifically, in the prediction model equation creation process, for each of many items of sound-source already-known data, the degree of similarity to the sample data created at step S101 and the maximum noise level are calculated as values of explanatory variables (x1 to xn). With the use of a predetermined prediction model, coefficients (a0 to an) and the like are calculated by an optimization method such as a maximum likelihood method. Therefore, it is possible to create (derive or calculate) the prediction model equation.

Incidentally, in an actual system for carrying out noise judgment, when the prediction model equation is created, the prediction model equation is stored in the storage unit 120 and used by the probability value calculation unit 140.

With reference to FIG. 9, the following provides a more detailed description of the prediction model equation creation process at step S102 as steps S1021 to S1027.

(Step S1021)

At step S1021, the prediction model equation calculation unit 130 performs a sound-source already-known data acquisition process.

In the sound-source already-known data acquisition process, the prediction model equation calculation unit 130 cuts the time-series data of signal strength of a predetermined period of time from among a group of already-known data stored in the storage unit 120 in a similar way to the time-series data acquisition process of step S1011.

At this time, it is possible to cut out the time-series data in such a way that the greatest value of the signal strength comes to the center of the predetermined period of time. If it is difficult to calculate the greatest value, adjustments may be made before the time-series data is cut out.

(Step S1022)

At step S1022, the prediction model equation calculation unit 130 performs a normalization process with the use of the maximum signal strength for the sound-source already-known data.

The normalization process is performed by the prediction model equation calculation unit 130 in a similar way to step S1012 for the cut-out time-series data.

(Step S1023)

At step S1023, the prediction model equation calculation unit 130 performs a process of calculating the degree of similarity (x1) to the sample data of the to-be-measured/analyzed target.

Specifically, the value of the degree of similarity (x1) is calculated between the sound-source already-known data and a group of sample data of aircraft noise: x1 is a value used as one of explanatory variables of the above equation (1) and is used to derive the prediction model equation. As for the degree of similarity (x1), in a similar way to the calculation of the degree of similarity between time-series data items in the above cluster analysis, the degree of similarity to each item of sample data is calculated between the sound-source already-known data and each item of sample data with the use of a method such as the sum of the squares of differences between sampled signals, the sum of absolute values or the square mean.

Then, the degree of similarity (x1) can be calculated by combining the degrees of similarity to each piece of sample data.

More specifically, as for the degree of similarity (x1), for example, when the number of aircraft noise sample data items is 5, the degrees of similarity to each item of the sample data are regarded as da1 to da5 and da is calculated as the degree of similarity (x1). da may be the greatest value of da1 to da5 (the degree of similarity of the most similar one) or calculated by performing a variable conversion process in such a way that da increases if there is at least a highly similar one.

It is necessary to prepare many items of sound-source already-known data to create a highly reliable model.

In general, the sample size required to calculate an appropriate logistic regression equation is considered to be about 10 times larger than an explanatory variable if the number of events (aircraft noise or other noise) that occur and are to be included in a response variable is about the same. If there is a disparity between the occurrence numbers, a larger sample size is required.

However, if the number of explanatory variables is 10 and the sample size is about 200, more items of sound-source already-known data may need to be prepared because such numbers are not sufficient enough to reliably grasp the state of a noise to be modeled.

That is, a larger number of sound-source already-known data items needs to be used in creating a highly reliable prediction model equation.

(Step S1024)

At step S1024, the prediction model equation calculation unit 130 performs a process of calculating the degree of similarity (x2) to a group of sample data other than the to-be-measured/analyzed target. x2 is a value used as one of explanatory variables of the above equation (1) and is similarly used to derive coefficients of the prediction model equation.

The process is performed in a similar way to the calculation of the above degree of similarity (x1) between the sound-source already-known data and a group of sample data other than the to-be-measured/analyzed target.

That is, for example, when the number of noise sample data items other than those of aircraft is 4, the degrees of similarity of signals to each item of the sample data are regarded as dn1 to dn4. Based on dn1 to dn4, it is possible to calculate dn, the degree of similarity (x2). x2 is a value used as one of the above explanatory variables.

(Step S1025)

At step S1025, the prediction model equation calculation unit 130 performs a greatest value classification process of a predetermined period of time.

Specifically, among data of the strength of each signal within a cut-out section of the sound-source already-known data, the prediction model equation calculation unit 130 classifies values of data of the greatest signal levels (which are typically the greatest values during a predetermined period of time) according to categories (or classes, degrees) of the maximum noise level (dB).

The reason the maximum noise levels are thus classified according to categories is that it is not possible to make such assumptions as monotonically decreasing or increasing for the relationship between the value of data of the maximum level and the fact that the noise is an aircraft noise or not. Specifically, if the value of the maximum level is input into the equation 1, the probability of being an aircraft noise increases or decreases in terms of the calculated prediction probability as the value of the maximum level becomes larger or smaller given the characteristic of the equation. However, such a model does not reflect the reality. Therefore, it is necessary to perform an appropriate process for the input maximum noise level. Thus, it is preferable that the categorizing classification method be used, because the categorizing classification method can be used without assumptions concerning the relationship (distribution). Moreover, it is considered that the use of variable conversion is also effective. However, given the fact that it is difficult to find, in theory, an appropriate function, the categorizing classification method is preferred. Variables other than the maximum noise level are categorized when necessary.

In particular, when a prediction factor is a quality-oriented variable or when there is only ordering information, the categorizing classification method is effective.

The categories are described with reference to FIG. 10. For example, variables are categorized into the following 6 categories on the basis of the greatest value of a predetermined period of time: a category that is less than 54 dB, a category that is greater than or equal to 54 dB and is less than 58 dB, a category that is greater than or equal to 58 dB and is less than 62 dB, a category that is greater than or equal to 62 dB and is less than 66 dB, a category that is greater than or equal to 66 dB and is less than 70 dB, a category that is greater than or equal to 70 dB.

(Step S1026)

At step S1026, the prediction model equation calculation unit 130 performs a process of making dummy variables (x3 to x7) for category classification.

In the above process, as shown in FIG. 10, a substitution value corresponding to each category (0 or 1) is used as a "dummy variable" for use in a logistic regression model. That is, the dummy variable is used to turn the quality-oriented values of category classification into numbers (0 or 1).

In this case, if the number of categories is N, the number of dummy variables required is N−1.

For example, if the number of categories is 6, the number of dummy variables required is 5, which corresponds to the case where X3=0, X4=0, X5=0, X6=0 and X7=0 for a category less than 54 dB.

The prediction model equation calculation unit 130 prepares a storage unit corresponding to each category and substitutes 1 into the storage unit corresponding to a category to which the greatest value of the predetermined period of time belongs, and 0 into other storage units.

x3 to x7 are values of explanatory variables of the equation (1) and are used to derive coefficients of the prediction model equation as well as digitized values (0 or 1).

FIG. 10 shows the case where the maximum noise level, which is the greatest value during the predetermined period of time, is 65 dB. In this case, 1 is substituted for x5, and 0 for x3, x4, x6 and x7.

Incidentally, the maximum noise level is not necessarily required as an explanatory variable of the prediction model equation. However, the use of the maximum noise level contributes to improving the accuracy.

(Step S1027)

At step S1027, the prediction model equation calculation unit 130 performs a process of calculating coefficients (a0 to an).

Specifically, the values of the explanatory variables (x1 to xn) calculated at the above steps S1023 to S1026 are substituted into the equation (2) described below that uses the results of judgment obtained from the actual sound-source already-known data in order to calculate the most appropriate coefficients (a0, a1, a2, a3, . . . , an).

For example, in the case where there are 7 explanatory variables (x1 to x7), if there is no confounding between prediction factors, the following equation is used to calculate values of coefficients.

$$\text{measurement member's judgment} = f(a0 + a1x1 + a2x2 + a3x3 + a4x4 + a5x5 + a6x6 + a7x7)(\text{measurement member's judgment: 0 or 1}) \quad \text{Equation (2)}$$

In the equation (2), a0 is a constant.

Moreover, the "measurement member's judgment" in the equation (2) represents the results of determining the type of a noise's sound source by a measurement member (the value of an response variable): the value of 0 or 1 is used.

That is, 1 is substituted for the sound-source already-known data when (for example after a measurement member listens to the actual sound listen-in data) the measurement member has determined a specific event (a to-be-measured/analyzed target, i.e. aircraft noise in the example here). When the measurement member determines an event other than a specific event (anything other than a to-be-measured/analyzed target, i.e. noise other than those of aircraft in the example here), 0 is substituted for the sound-source already-known data.

The prediction model equation calculation unit 130 stores in the storage unit 120 an equation used to calculate generated coefficients.

Incidentally, as for the above prediction factor, when a to-be-measured/analyzed target is aircraft noise as data of a noise level meter, it is particularly preferable that the degree of similarity between unknown data and sample data of the to-be-measured/analyzed target be used. In addition, with the degree of dissimilarity between unknown data and sample data of a target other than the to-be-measured/analyzed target as well as the maximum noise level of a predetermined period of time of unknown data, it is possible to make a high-accuracy aircraft noise prediction model.

In addition to the above prediction factors, indicators specialized in the measurement of aircraft noise, such as radio-wave identification information, which is data other than those of a noise level meter, an angle of elevation of a sound source, the frequency of the noise, are used for explanatory variables. Therefore, it is possible to further improve the accuracy.

The case where indicators that are data other than those of a noise level meter are used as prediction factors will be further described in detail in a second embodiment.

Here, the processes of steps S1021 to S1026 are performed for all items of sound-source already-known data. At step S1027, the most appropriate coefficients (a0 to an) are calculated. The equation of the equation (1) that uses the above coefficients turns out to be a prediction model equation.

In order to calculate the values of the coefficients, the values can be calculated with the use of a statistical program such as SPSS or R. As a method, an optimization method such as a maximum likelihood method can be used. When the maximum likelihood method is used, in order to calculate a parameter that maximizes the log likelihood, a nonlinear optimization method is used. For example, Fisher's scoring algorithm or the like can be used.

It is also possible to sequentially optimize coefficients for each item of the sound-source already-known data with the use of such a method as a steepest descent method. Other learning methods may be used.

Incidentally, a method of calculating the value of the coefficient and a method of calculating other logistic regression prediction model equations can be performed based on the method disclosed in the publicly-know literature: "An Introduction to Categorical Data Analysis," (by Alan Agrest, translation by Hiroyuki Watanabe and others, Scientist Press Co., Ltd. 2003).

The above ends the prediction model equation creation process

Incidentally, as for the prediction model equation, a process of testing, a process of examining validity and the like can be performed when necessary.

For example, as for the prediction model equation, the process of examining validity can be performed by carrying out a goodness-of-fit test such as the Hosmer-Lemeshow test.

Moreover, even for each explanatory variable, the validity can be evaluated on the basis of a confidence interval such as the 95 percentile of a confidence interval of the calculated coefficient.

The control unit 150 can output the results of the test or the results of the test of validity from the output unit 160.

In addition, when the results of the evaluation shows that the validity of each explanatory variable is low, a warning can be output to the output unit 160 so that the explanatory variable is not to be used or that the number of sound-source already-known data items used to create the prediction model equation increases.

It is also possible to automatically judge whether to increase or decrease the explanatory variables.

The above ends the prediction model creation process.

The final noise judgment is made by a probability calculation process described below with the use of the prediction model created by the prediction model creation process.

(Flow of Probability Value Calculation Process)

The following describes in detail a probability value calculation process with reference to FIG. 11.

The probability value calculation unit 140 of the server 100 inputs to the input unit 110 the unrecognized data (sound-source unknown data) that is measured by automatic measurement of noise and is sampled. The probability value calculation unit 140 performs a probability value calculation process to calculate a probability. value by using the one that is so processed as to apply each item of the measured data or measured data to the prediction model equation and applying the one to the prediction model equation as an explanatory variable.

The following describes the flow of the probability value calculation process in a concrete way.

(Step S201)

At step S201, the probability value calculation unit 140 performs a sound-source unknown data acquisition process.

The sound-source unknown data is the time-series data of unknown sound in terms of whether the data is aircraft noise or not as described above.

In the sound-source unknown data acquisition process, the probability value calculation unit 140 cuts out the time-series data of signal strength of a predetermined period of time for noise judgment from a group of data measured by the sensors 200-1 to 200-n that is stored in the storage unit 120 as in the time-series data acquisition process of step S1011.

As described above, it is also possible to cut out the time-series data in such a way that the greatest value of the signal is positioned at the center of the predetermined period of time.

(Steps S202 to S206)

From steps S202 to S206, the probability value calculation unit 140 performs similar processes to the processes of steps S1022 to S1026 for the sound-source unknown data.

That is, the following processes are performed: the normalization process with the maximum signal strength (Step S202), the process of calculating the degree of similarity (x1) to a group of sample data of aircraft noise (Step S203), the process of calculating the degree of similarity (x2) to a group of sample data other than those of aircraft (Step S204), the greatest value classification process of a predetermined period of time (Step S205), and the process of making dummy variables (x3 to x7) for category classification (Step S206).

Therefore, the probability value calculation unit 140 can calculate the values of the explanatory variables (x1 to xn), which are input into the prediction model equation, for the sound-source unknown data.

(Step S207)

At step S207, the probability value calculation unit 140 performs a process of substituting explanatory variables (x1 to xn).

Specifically, the probability value calculation unit 140 substitutes x1 to x7 that are calculated at the above step for the sound-source unknown data into the prediction model equation.

Therefore, the value (probability value) of the prediction probability p for the to-be-measured/analyzed target is calculated.

The above ends the probability value calculation process.

The probability value is a prediction probability of an event (aircraft noise, for example) that the prediction model expects to happen, which is required when the observed data is input as an explanatory variable. Thanks to the probability value, it is possible to judge whether the observed data is the to-be-measured/analyzed data.

The control unit 150 outputs the probability value to the output unit 160 and makes the final noise judgment as described above.

When the noise of aircraft is judged, for example, a threshold value used to determine aircraft noise is set to 70%, and a threshold value used to determine noises other than those of aircraft to 30%. In this case, it is automatically judged that the sound-source unknown data whose probability value obtained is greater than or equal to 70% is aircraft noise. Similarly, when the probability value is less than or equal to 30%, it is automatically judged that the sound-source unknown data is not aircraft noise. Moreover, when the probability value falls within the range of 30% to 70%, the displaying of a waning or another process is performed to encourage a user to make a comparison with the actual sound data.

That is, the advantage is that it is not necessary for a measurement member to make a comparison every time since the measurement member should make a comparison with the actual sound data only when the probability is 30% to 70%.

After the above processes are performed, the noise judgment process ends.

EXAMPLE 1

The following describes an example of the actual noise judgment with reference to FIG. 12.

FIG. 12 is a table showing an example of the results of measuring and analyzing noise with the use of logistic regression analysis. The table actually shows the results of noise judgment after the sound-source unknown data is input into the prediction model equation created by calculating the coefficients (a0 to a7) with the use of the explanatory variables (x1 to x7) related to prediction factors such as those described above, with aircraft noise regarded as a to-be-measured/analyzed target.

In the table, the sound-source unknown data items are arranged in the order that the sound-source unknown data items occur. The columns of the table represent the following factors of each item of the sound-source unknown data: occurrence time of noise, noise value (maximum noise level or maximum noise value), duration time of noise (the time during which the noise grows and becomes greater than or equal to a predetermined level compared with dark noise and then drops and becomes less than or equal to a predetermined level compared with dark noise), dark noise (the average of signal levels of dark noise during a predetermined period of time), probability value (the value obtained by substituting the values of x1 to x7 calculated from the sound-source unknown data into the prediction model equation), sound source (the result of the actual judging, determining and examining of the type of noise by a measurement member on the basis of the actual sound listen-in data or other data as for each sound-source unknown data item).

It is clear from the table that, in reality, it is possible to correctly determine aircraft noise as a measurement member does if the calculated probability value is greater than or equal to 50%.

Conversely, when the probability value is less than or equal to 50%, the noise is not aircraft noise if the type of the noise is actually judged by the measurement member. For example, the probability value of the noise that occurs at 12:00:26 is less than 0.1%. After the measurement member actually listens to the actual sound to judge, it is found that the noise comes from a disaster-prevention wireless system.

In this manner, even if the noise cannot be distinguished from other types of noise when only the maximum noise level and duration time are used, the noise judgment can be made by substituting such data as signal levels of noise into the prediction model equation and calculating the probability value.

As shown in FIG. 12, the use of only the time-series data of the signal strength of the noise and the maximum noise level data makes it possible to create the prediction model equation that is almost the same as the actual sound listen-in data. When the results of the noise judgment of the actual sound listen-in data by a measurement member is compared with the results of the noise judgment of the embodiment of the present invention, it is possible to create a prediction model equation whose W-value ("an index of how noisy the noise is") is less than or equal to 1.

The W-value stands for Weighted Equivalent Continuous Perceived Noise Level (WECPNL) and is a standard of aircraft noise to evaluate an effect on people's lives with the greatest importance being attached to the noises in the night time and the factors concerning the strength, frequency, and duration time of the acoustics being added. The W-value is also used in the calculation of Japan's environmental standards.

As described above, the prediction model equation of the first embodiment of the present invention and the calculation method of the probability value are so accurate that it is possible to improve the accuracy of the noise judgment process that uses the above.

Incidentally, even when only the time-series data is used for a prediction factor or when only the electric field strength and maximum signal level described below are used, it is possible to determine aircraft noise. In this manner, a prediction factor is freely selected for the to-be-measured/analyzed target, and a more appropriate prediction model for the measurement/analysis state can be used.

Thanks to the adoption of the above configuration the following effects can be obtained.

According to an automatic measurement device for noise of Conventional Technique 1, if the automatic measurement device cannot appropriately set a recognition condition, the automatic measurement device may accept data other than the to-be-measured/analyzed target or fail to accept the data. In this case, it takes extra time and effort in the process of sorting out data of the measured noise. There is also a fear that the reliability of the measured values is damaged.

Therefore, in the case of the automatic measurement device for noise of Conventional Technique 1, even after the operation has started, when the validity of the recognition results is confirmed, a measurement member needs to directly check the actual sound by listening to the recorded actual sound concerning all the data items. Therefore, the problem is that it takes considerable time and effort to confirm the validity.

In the case of the noise measurement method of Conventional Technique 2, the problem is that when a to-be-measured/analyzed target and other noises are simultaneously observed or when the difference between the noise and dark noise is small, a mistake is often made in recognizing the noise.

In the cases of Conventional Techniques 1 and 2, therefore, the problem is that to set a recognition condition for automatically measuring noise, a measurement member needs to stay in the fields for a long period of time to make adjustments.

Another problem is that depending on circumstances of a place where measurement is carried out, it is necessary for a measurement member to confirm whether a mistake is made in recognizing the noise in the end, which takes a lot of time and effort.

Meanwhile, with the use of the noise judgment process of the first embodiment of the present invention, the most appropriate prediction equation can be statistically obtained from the above data. Therefore, it is possible to provide a highly reliable noise judgment method without the need for a measurement member to make adjustments to the recognition condition.

Moreover, according to the noise judgment process of the embodiment of the present invention, a signal judgment process is performed for a to-be-measured/analyzed target (specific event). For example, if a noise judgment is made for time-series data that is not a to-be-measured/analyzed target, the output value decreases. Therefore, it is possible to accurately recognize that the time-series data is not a to-be-measured/analyzed target.

Therefore, after the operation of a signal recognition system has started, a probability value is calculated by applying the prediction model equation to the unknown sound-source data, allowing a measurement member to recognize and confirm noise only for the data whose probability value is within a predetermined range.

Therefore, the advantage is that it is possible to significantly reduce the time and effort (costs) required to make a noise judgment.

According to the noise judgment processes of Conventional Techniques 1 and 2, there may be changes depending on environmental conditions such as seasonal factors. Therefore, a measurement member is required to measure noise and set a recognition condition in the fields on regular basis.

On the other hand, according to the noise judgment method of the first embodiment of the present invention, it is possible to accumulate the sound-source already-known data even after the operation has started and automatically calculate (create) the prediction model equation again on the basis of the accumulated data.

Thanks to the accumulated sound-source already-known data, it is possible to further improve the accuracy of the prediction model equation. That is, the advantage is that it is possible to further improve the accuracy of prediction in the noise judgment process because the data is accumulated even after the operation has started.

Needless to say, another advantage is that it is unnecessary for a measurement member to make adjustments again to the recognition condition in the fields after a predetermined period of time has passed.

Moreover, it is possible to set the prediction model equation according to seasonal factors. Since the prediction model equation for a season (for example, an egg-laying season of frogs or a season of chirping insects) is used, it is possible to further improve the accuracy.

Moreover, according to Conventional Technique 1, it is necessary to set a recognition condition for each of the measurement environments.

Meanwhile, according to the noise judgment method of the first embodiment of the present invention, the advantage is that it is possible to handle the same to-be-measured/analyzed targets once the prediction model equation is created.

Therefore, when a noise judgment is made for the same to-be-measured/analyzed target at a different place, it is possible to minimize the need to collect the already-known sound-source data and create the prediction model equation again.

That is, the advantage is that, for example, with the use of the prediction model equation of aircraft noise that is created in advance, it is possible to make a noise judgment anywhere.

Moreover, according to the prediction model equation that is thus created in advance, even if a noise source other than a to-be-measured/analyzed target is different or there is a decrease in the accuracy due to differences of various environmental conditions, it is possible to improve the accuracy by accumulating the sound-source already-known data and create the prediction model equation again as described above.

Moreover, it is possible to objectively evaluate noise with the use of time-series data in the noise judgment process according to the embodiment of the present invention.

Accordingly, another advantage is that it is possible to make a standard noise judgment model (standard model) thanks to the time-series data.

That is, as for the recognition condition that has been so far calculated based on experience, it is possible to objectively evaluate as an increase or decrease of a parameter of a model generalized by the prediction model equation.

<Second Embodiment>

The following describes a server 101 of a noise judgment system according to a second embodiment of the present invention, with reference to FIG. 13.

The configuration of the noise judgment system that uses the server 101 is the same as that of the noise judgment system X of the first embodiment shown in FIG. 1 except for the control configuration of the server 101.

The server 101 is different from the server 100 in that a data integration unit 170 (data integration means) is added.

Incidentally, other building blocks indicated by the same reference symbols are the same as those of the server 100.

The data integration unit 170 is an arithmetic unit such as DSP or CPU that performs a calculation when a prediction factor is added or when a plurality of prediction model equations are used. Like the above prediction model equation calculation unit 130 or probability value calculation unit 140, the data integration unit 170 may be realized by an arithmetic function of the control unit 150.

It is possible for the server 101 of the second embodiment of the present invention to create, with the use of the data integration unit 170, a plurality of prediction model equations to which prediction factors are added and evaluate data when sound-source unknown data is applied to a plurality of prediction model equations. Therefore, it is possible to further improve the reliability of a prediction model (probability model).

For example, except for the signals of a noise level meter, the signals to be added may be radio-wave identification information data or data of a sound-source search/identification device (SBM) or the like when the prediction model is for aircraft noise. As a result, it is possible to lower the probability of mistakenly recognizing data other than those of aircraft as data of aircraft.

Thus, it is possible to bring the W-value closer to the value that is based on the results of manned measurement or the results of judgment obtained after a person listens to actual sound. That is, the advantage is that the reliability of the output results improves.

Incidentally, as for the data of signals associated with the above prediction factors to be added, the server 101 may acquire the data detected by the sensors 200-1 to 200-n, the information of other sensors and the like or of an information site or the like directly from the network 5, or the data directly through a storage medium.

(Flow of Creation of a Group of Prediction Model Equations When Signals are Added)

With reference to FIG. 14, the following describes a flow of a process of creating a group of prediction model equations when the to-be-measured/analyzed signals are added, according to the second embodiment of the present invention.

(Steps S301 to S302)

The same processes are performed at step S301 and step S101 and at step S302 and step S102.

(Step S303)

Then, at step S303, the control unit 150 makes a determination as to whether the creation of a prediction model equation associated with the added data item xi has been completed.

When the answer is YES, the control unit 150 ends the creation process of the prediction model equations.

When the answer is NO, the control unit 150 lets the process return to step S302 and keeps creating the prediction model equations associated with the remaining additional data items xi.

In the server 101 of the second embodiment of the present invention, the data items associated with the added prediction factors are added as explanatory variables xi; each time the data item is added, the prediction model equation is created.

First, as in the case of the server 100 of the above first embodiment, for example, in the case of aircraft noise, the prediction model equations that use only data of a noise level meter (waveform+maximum level) are created with the use of explanatory variables x1 to x7 (with the use of coefficients a0 to a7).

Each of the prediction model equations is stored in the storage unit 120 by the control unit 150.

Incidentally, in order to use the data associated with a quality-oriented indicator as an explanatory variable, as in the case where the above dummy variables for category classification are made, dummy variables can be used.

For example, in the case where the information of radio-wave identification signals is added as one explanatory variable, when the process returns to step S302, i is set to 8 and the prediction model equation is created with the use of explanatory variables x1 to x8 (with the use of coefficients a0 to a8).

Similarly, when the process then returns to step S302, i of the frequency of a sound source is set to 9 and the prediction model equation is created with the use of x1 to x9 (with the use of coefficients a0 to a9). As the frequency thereof, a unique value of frequency can be used.

Similarly, even when angle-of-elevation data of a sound source is added, the prediction model equation containing the angle-of-elevation data is created.

Furthermore, for the angular velocity of a sound source, the prediction model equation is created in a similar way.

That is, even for indicators associated with the angle-of-elevation data and angular velocity of a sound source, it is possible to prepare explanatory variables.

As for the angle-of-elevation data, in terms of such a unit of angle as radian, the angle-of-elevation data can be used as one variable for one axis.

As for the angular velocity, the angular velocity can be represented with the use of a horizontal rotation angle or vertical rotation angle.

Incidentally, in the directions of x-, y- and z-axes, the angle-of-elevation data can also be represented by adding the magnitude of a vector to the above or performing other processes.

Moreover, explanatory variables may be used for the vertical angular velocity and the horizontal angular velocity. Furthermore, it is possible that one indicator is provided by combining the vertical angular velocity and the horizontal angular velocity.

Moreover, as for the frequency, it is also possible to use signal levels of several frequency bands and the like. Needless to say, in this case, a plurality of explanatory variables can be used for each frequency band.

In that manner, in order to improve the accuracy of the prediction model equation for each specific event corresponding to the to-be-measured/analyzed target, it is possible to input explanatory variables associated with any prediction factors.

(Probability Value Calculation Process When Signals are Added)

The following describes the flow of a probability value calculation process when signals are added according to the second embodiment of the present invention, with reference to FIG. 15.

In the process described below, the initial value i is equal to 1; a probability value p is calculated with the use of each prediction model equation.

(Step S401)

First, at step S401, for xi, probability values are calculated with the use of the prediction model equation in the same way as those of steps S201 to S207.

At this time, the calculated probability values p are stored in the storage unit 120.

(Step S402)

At step S402, the control unit 150 makes a determination as to whether the calculation of the probability value of the prediction model equation associated with the added data item xi has been completed.

When the answer is YES, the control unit 150 allows the process to proceed to step S403.

When the answer is NO, the control unit 150 allows the process to return to step S401 to continue the process of calculating probability values associated with the remaining additional data items xi.

(Step S403)

At step S403, the data integration unit 170 performs a data integration process.

Specifically, for each prediction model equation for each of the explanatory variables and each probability value, the data integration unit 170 performs processes, such as confirming whether the prediction model equation that uses the explanatory variable is possible, checking log likelihood, or carrying out various statistical tests. Therefore, it is possible to evaluate the effectiveness of the prediction model equation.

Thanks to the above evaluation, it is possible for the data integration unit 170 to issue a warning from the output unit 160 when the addition of the exemplary variable is not appropriate (i.e. when a coefficient of the explanatory variable is not significant in the 95% confidence interval, for example). Therefore, it is possible for a measurement member to evaluate the selection of a prediction factor and the addition of an appropriate explanatory variable associated with the prediction factor.

Moreover, since the data integration unit 170 could be in the state of over-fitting when an explanatory variable is added, it is possible to perform processes when necessary, such as carrying out tests again after data items are increased or confirming with cross-validation or the like.

Final output values are combined by the above processes.

Therefore, the advantage is that it is possible to select an appropriate prediction factor for each to-be-measured/analyzed target.

Thus, since a better prediction model can be created, it is possible to make the probability values for noise judgment more accurate as well as to improve the reliability.

Moreover, at step S403, in addition to the above evaluation, the control unit 150 summarizes each prediction model and each probability value for each of the above explanatory variables and outputs from the output unit 160.

Incidentally, in addition to the above, the control unit 150 can also output waveform data and audio data whose probability value is out of a predetermined range (in the case of 30% to 70%, for example). Therefore, it is possible for a measurement member to check "suspicious" data.

Moreover, only the data of a specific noise can be stored in the storage unit 120.

As a result, the noise judgment process of the second embodiment of the present invention ends.

EXAMPLE 2

With reference to FIGS. 16 to 18, the following describes an example of an actual noise judgment process according to the second embodiment of the present invention.

FIGS. 16 and 17 show an example of measurement/analysis results (example of prediction). The graph is about the so-called reliability of the obtained probability when the prediction model equation is actually created after the explanatory variables associated with the prediction factors are added.

The "results (1)" of FIG. 16 show a graph showing an error rate. The horizontal axis of the graph represents the number of explanatory variables xi, and the vertical axis represents the error rate (%).

From left to right, the horizontal axis represents: the case where the prediction model equation (i=8) that uses only the data of a noise level meter of the first embodiment is used; the case where the information of a radio-wave identification signal is added to the standard model; the case where the peak frequency of a sound source is further added; the case where sound-source angle-of-elevation data is further added; and the case where the angular velocity of a sound source is further added.

The vertical axis represents an error rate (%) for a group of sound-source unknown data.

That is, it is judged that an error occurs in the recognition in the following cases: (a) the case where the sound-source unknown data is not aircraft noise (false positive) when the probability value obtained from the prediction model equation whose to-be-measured/analyzed target is aircraft is greater than or equal to 50%; (b) the case where the sound-source unknown data is aircraft noise (false negative) when the obtained probability value is less than 50%. The percentage of the sound-source unknown data for which an error occurs in the recognition is the error rate. In determining whether an error occurs in the recognition, a measurement member listens to the actual sound data of the sound-source unknown data and makes a judgment as to whether the data is aircraft noise.

As shown in the graph, the error rate is lowered as the explanatory variables xi are added.

The "results (2)" of FIG. 17 show the results of examination into the difference between the predicted and measured values on the basis of the W-value (WECPNL) with the use of a similar prediction model equation to that in the above results (1). The vertical axis represents the level difference between the predicted and measured values (W-value), and the horizontal axis represents the number of explanatory variables xi.

As in the case of the above (1), what is shown here is the difference between the predicted and measured values concerning the W-value when it is judged that the sound-source unknown data whose probability value is greater than or equal to 50% is aircraft noise.

When the same standard model as that of the first embodiment is used, the standard model can be used in a practical manner, because the difference between the predicted and measured values is less than or equal to 1 as described above.

Moreover, it is clear that by adding the explanatory variables xi, it is possible to reduce the difference between the predicted and measured values.

FIG. 18 is a table showing part of the analysis data used in the examples of FIGS. 16 and 17 in order of occurrence. The columns show: occurrence time of noise associated with the sound-source unknown data; noise value; probability value in the case of a standard model; probability value when the information of a radio-wave identification signal is added to the standard model; results of noise judgment by a measurement member (o: aircraft noise, x: noise other than those of aircraft); and type of noise recognized by the measurement member.

The portions surrounded by bold rectangular frames in the analysis data represent portions where errors occur in the noise judgment process of the signal judgment method of the embodiment of the present invention.

However, it is obvious that the accuracy of prediction improves as the noise judgment process is performed after the radio-wave identification signal is added to the prediction model equation in the standard model.

Thanks to the adoption of the above configuration, the following advantages can be obtained.

According to Conventional Technique 1, a method of objectively adding various kinds of data to the recognition condition of noise judgment has not been known.

That is, in the past, the frequency of noise and the like have been checked by a measurement member and used to judge noise on an empirical basis. However, a method of turning the frequency and the like into numbers has been unknown.

On the other hand, according to the noise measurement process of the second embodiment of the present invention, by adding the values (which are, for example, radio-wave identification information data, data of a sound-source search/identification device (angle-of-elevation data of a sound source), data of the frequency of the noise, and the like) that has so far been used on an empirical basis to the prediction model equation, the prediction model equation with higher accuracy of prediction can be created.

Moreover, it is possible to evaluate the effectiveness of the prediction model equation when needed. Therefore, it is possible to create the prediction model equation with higher accuracy by adding only required data.

Thus, the advantage is that it is possible to improve the accuracy of the prediction of noise judgment.

Moreover, it is possible to create the prediction model equation by simultaneously using signals from a plurality of nearby sensors as a plurality of explanatory variables.

Thus, for an unexpected noise such as the crying of a crow around one sensor, it is possible to raise the accuracy of the prediction of noise judgment.

Moreover, the noise judgment process of the second embodiment of the present invention is characterized in that a prediction factor other than those of a noise level meter is used and a plurality of prediction model equations is used.

Therefore, even when a specific measuring instrument in the sensors 200-1 to 200-n is malfunctioning, it is possible to set so that the prediction probability is obtained with the use of a prediction model equation that does not use the data of the measuring instrument as a prediction factor.

In the above case, the accuracy of the prediction probability may drop compared with the case where all the prediction factors are used. However, some of the data items can be obtained. For example, even if a field strength meter or antenna thereof is malfunctioning, the data of a noise level meter is enough to carry out the noise judgment process.

Therefore, even if data is measured during a period from when a sensor starts malfunctioning until the sensor is back in use after repair or replacement work, the data is not regarded as among the data that are not measured. It is possible to dramatically reduce the time when data is not measured, which is often attributable to the malfunctioning of a sensor in a long-term unmanned automatic measurement operation. Therefore, it can reduce the time, effort and cost of manually repairing data items one by one or identifying by listening to the actual sound.

Incidentally, for the noise judgment processes of the first and second embodiments of the present invention, what has been described is an example in which the maximum noise levels are classified into categories. However, it is possible to use only the time-series data. Even in this case, the accuracy is sufficient. It is also possible to judge without using any time-series data other than the to-be-measured/analyzed target. That is, as described above, the following factors are not necessarily required: "the difference between the already-known data and the sample data other than the to-be-measured/analyzed target" and "the maximum signal strength of a predetermined period of time of the already-known data." It is possible to further raise the accuracy if the indicators of the above difference and strength are put into the prediction model equation as explanatory variables.

Moreover, it is not necessary to perform a cluster analysis process to create the sample data. That is, thanks to cluster analysis, it is possible to select the sample data that is more accurate. Among the sample data, it is possible for a measurement member to select and prepare exemplary data.

As for a plurality of the above prediction model equations, the above has explained that the prediction model equation is created by increasing the number of explanatory variables xi for each prediction factor. Needless to say, it is also possible to prepare the prediction model equation for each combination of prediction factors. Therefore, it is possible to improve the redundancy when a specific measuring instrument is malfunctioning as described above.

<Third Embodiment>

What has been described of the noise judgment processes of the above first and second embodiments is the noise judgment processes for mainly noise signals of aircraft with aircraft noise as a to-be-measured/analyzed target.

However, as for other noise sources such as automobile noise or factory noise, if the prediction model equation is created as a specific event that becomes a to-be-measured/analyzed target, the prediction model equation can be applied to the noise sources.

Besides noise, as for vibrations, the prediction model equation of a to-be-measured/analyzed target can be created and applied to various kinds of vibrations, such as vibrations of railroads, vibrations of factories and vibrations of construction.

For example, for vibrations of construction, a signal judgment (vibration judgment, in this case) can be made after a model is created based on an environmental quality standard such as "Standards for the regulation of noise produced by specified construction work" announced by the Ministry of the Environment.

In this case, a vibration judgment can be made in the same way as the noise judgment processes of the above first and second embodiments just by applying already-known data such as time-series data of a vibration meter or unknown data to the prediction model equation. At this time, it is necessary to use an appropriate explanatory variable or a response variable for the to-be-measured/analyzed target.

Moreover, in a signal judgment system of a third embodiment of the present invention, it is possible to change a plurality of to-be-measured/analyzed targets and the prediction model equation of each to-be-measured/analyzed target thereof for use.

The configuration of devices and the control configuration in the signal judgment system of the third embodiment of the present invention are the same as in the noise judgment system X of the first embodiment shown in FIG. 1.

However, as shown in FIG. 19, a server 102 of the signal judgment system of the third embodiment of the present invention is equipped with a multiple to-be-measured/analyzed target select ion unit 180 for selecting a prediction model equation for each to-be-measured/analyzed target associated with various vibrations or noises as well as data used in calculating the prediction model equation.

The multiple measurement/analysis target selection unit is equipped with a WWW browser and the like. After receiving an instruction of a control PC (Personal Computer), which is not shown, from the network 5, the multiple measurement/analysis target selection unit can change the to-be-measured/analyzed targets. The multiple measurement/analysis target selection unit has a built-in timer. The multiple measurement/analysis target selection unit can make arrangements, such as making aircraft noise a to-be-measured/analyzed target at a predetermined time and making automobile noise a to-be-measured/analyzed target at another time. For data accumulated in the storage unit 120, it is also possible to make a signal judgment as to another to-be-measured/analyzed target.

Moreover, for each of a plurality of sensors 200-1 to 200-n connected, the server 102 can set which signals of prediction factors are acquired.

Therefore, with the use of the same system, it is possible to make a signal judgment as to another to-be-measured/analyzed target at the same place.

FIGS. 20A to 20D show an example of the types of already-known data and unknown data used in the noise judgment process and the vibration judgment (signal judgment) process for each to-be-measured/analyzed target: the types are collectively shown for each to-be-measured/analyzed target. Moreover, each item of data is explained; the examples thereof are shown.

Incidentally, needless to say, each of the data items can also be used in the prediction model equation of the first or second embodiment. In this case, however, each of the data items is used for each to-be-measured/analyzed target of the prediction model equation.

When the to-be-measured/analyzed target is aircraft noise, for example, a model of the to-be-measured/analyzed target may be a model of the to-be-measured/analyzed target that uses data concerning any of the following attributes: time-series noise data, maximum noise level, maximum noise level occurrence time, transponder response radio-wave electric-field strength level, radio-wave altimeter radio-wave electric-field strength level, airframe identification number, flight altitude, takeoff/landing, dark noise level, one-off noise exposure level, noise duration time, sound-source coming direction, moving sound-source flag, frequency characteristic, time-series data of sound-source strength level, time-series data of sound-pressure waveform, wind direction, wind speed, temperature, humidity, and atmosphere pressure.

When the to-be-measured/analyzed target is road traffic noise, for example, a model of the to-be-measured/analyzed target may be a model of the to-be-measured/analyzed target that uses data concerning any of the following attributes: time-series noise data, maximum noise level, maximum noise level occurrence time, transit speed, dark noise level, one-off noise exposure level, noise duration time, sound-source coming direction, moving sound-source flag, frequency characteristic, time-series data of sound-source strength level, time-series data of sound-pressure waveform, wind direction, wind speed, temperature, humidity, atmosphere pressure, road surface condition, and weather.

When the to-be-measured/analyzed target is road traffic vibrations, for example, a model of the to-be-measured/analyzed target may be a model of the to-be-measured/analyzed target that uses data concerning any of the following attributes: time-series vibration data, maximum vibration level, maximum vibration level occurrence time, transit speed, background vibration level, one-off vibration exposure level, vibration duration time, vibration-source coming direction, moving vibration-source flag, frequency characteristic, time-series data of vibration-source strength level, time-series data of vibratory-pressure waveform, wind direction, wind speed, temperature, humidity, atmosphere pressure, road surface condition, and weather.

When the to-be-measured/analyzed target is railroad noise, for example, a model of the to-be-measured/analyzed target maybe a model of the to-be-measured/analyzed target that uses data concerning any of the following attributes: time-series noise data, maximum noise level, maximum noise level occurrence time, electric-field strength level, transit speed, up/down, dark noise level, one-off noise exposure level, noise duration time, sound-source coming direction, moving sound-source flag, frequency characteristic, time-series data of sound-source strength level, time-series data of sound-pressure waveform, wind direction, wind speed, temperature, humidity, and atmosphere pressure.

When the to-be-measured/analyzed target is railroad vibrations, for example, a model of the to-be-measured/analyzed target may be a model of the to-be-measured/analyzed target that uses data concerning any of the following attributes: time-series vibration data, maximum vibration level, maximum vibration level occurrence time, electric-field strength level, transit speed, up/down, background vibration level, one-off vibration exposure level, vibration duration time, vibration-source coming direction, moving vibration-source flag, frequency characteristic, time-series data of vibration-source strength level, time-series data of vibratory-pressure waveform, wind direction, wind speed, temperature, humidity, and atmosphere pressure.

When the to-be-measured/analyzed target is factory noise, construction noise or any other environmental noise, for example, a model of the to-be-measured/analyzed target may be a model of the to-be-measured/analyzed target that uses data concerning any of the following attributes: time-series noise data, maximum noise level, maximum noise level occurrence time, dark noise level, one-off noise exposure level, noise duration time, sound-source coming direction, moving sound-source flag, frequency characteristic, time-series data of sound-source strength level, time-series data of sound-pressure waveform, wind direction, wind speed, temperature, humidity, atmosphere pressure and weather.

When the to-be-measured/analyzed target is factory vibrations or construction vibrations, for example, a model of the to-be-measured/analyzed target may be a model of the to-be-measured/analyzed target that uses data concerning any of the following attributes: time-series vibration data, maximum vibration level, maximum vibration level occurrence time, background vibration level, one-off vibration exposure level, vibration duration time, vibration-source coming direction, moving vibration-source flag, frequency characteristic, time-series data of vibration-source strength level, time-series data of vibratory-pressure wave form, wind direction, wind speed, temperature, humidity, atmosphere pressure and weather.

Needless to say, the data is not limited to the above. Any kinds of relevant data can be used to identify each to-be-measured/analyzed target.

Thanks to the above configuration, with the use of signals from the sensor 200-n equipped with the one that is jointly used for a plurality of to-be-measured/analyzed targets such as a noise level meter, it is possible to make a signal judgment as to a plurality of to-be-measured/analyzed targets.

Therefore, with one sensor being installed, it is possible to objectively evaluate a plurality of noise sources at the same place.

Thus, as for the identifying of a noise source and the type of noise or vibrations that affects the human body, it is possible to carry out more detailed analysis.

Since the same sensor is used, it is possible to reduce costs.

For example, even when the to-be-measured/analyzed target is aircraft noise, it is possible to use signals from the sensor 200-n that is used for automobile noise.

That is, the originally installed sensor can be used in another signal judgment process without change. Therefore, the advantage is that it is possible to reduce costs.

Moreover, when the to-be-measured/analyzed target is aircraft noise and the prediction probability thereof is for example 30 to 70%, it is possible to perform processes such as making a comparison with the probability value calculated by another prediction model equation as to whether the noise corresponds to another to-be-measured/analyzed target (automobile noise, for example).

In the case of the above example, the sensors for detecting automobile noise do not include a sensor of electric-field strength and the like. Therefore, as described above, it is possible to make a judgment using only the waveform data of signal strength.

Incidentally, to solve the problem of making a judgment as to signals with the use of other kinds of time-series data, the present invention's method of calculating prediction models and output values can be used.

For example, the method can be used to figure out the water release timings of a plurality of dams on the basis of changes in the volume of water of a sewer system.

Moreover, any data can be used as long as the data is time-series data or data associated with time-dependent changes of the signal strength. For example, the following data can be used: environmental data such as those indicating changes in the volume of water, biological data such as those indicating changes of AT/GC content of a genome sequence or the secondary structure of protein (degree of α-helix), and economic data such as those indicating changes in the volume of inventories/shipping or changes in share prices.

Even in the above case, with the use of the time-series data of "sample data" and "already-known data," a signal judgment can be made to identify mainly the type and characteristic of "unknown data."

According to the first and second embodiments of the present invention, an example in which logistic regression analysis is used is described. However, the method to be used is not limited to the above. Such statistical methods as various non-parametric methods and various time-series analysis methods can be used.

A noise judgment can be made with the use of an artificial intelligence method such as perceptron, neural network and SVM (Support Vector Machine).

In this case, a different prediction model and learning method can be used.

For example, when a three-layer neural network is used, the values of the above explanatory variables (x0 to xn) are input into the first layer. Some hidden layers of the second layer are prepared. The values are output from an output layer of the third layer.

Then, the three-layer neural network can be so formed as to set "fire" (which causes information to propagate to the next neuron) to the input from each layer, for example, with a sigmoid function or the like.

The value output from the output layer is 0 to 1. For the output, it is possible to optimize the operation of a neuron thanks to a learning method such as back propagation (error back propagation method).

Unknown sound-source data is applied to the three-layer neural network for which the learning is completed. With the use of an output value output from the output layer of the third layer, it is possible to make a noise judgment.

When the output value from the neural network is greater than or equal to a predetermined value (0.5, for example), it is possible to determine a to-be-measured/analyzed target, which is for example aircraft noise or the like.

Such an output value is not a probability value in terms of statistics. However, according to the present invention, the "probability value" includes even the above output values 0 to 1.

Incidentally, if the output value is not within the range of 0 to 1 according to a method in use, the output value obtained when unrecognized data is input is normalized with 0.0 to 1.0, and a noise judgment is made with the use of the value of the normalized output value.

Incidentally, the configurations and operations of the above embodiments are examples. Needless to say, modifications may be made when necessary without departing from the scope of the present invention.

BRIEF DESCRIPTION OF DRAWINGS

FIG. 3 is a conceptual diagram illustrating the outline of a noise judgment process according to the first embodiment of the present invention.

FIG. 10 is a conceptual diagram illustrating a method of making dummy variables for class classification according to the first embodiment of the present invention.

FIG. 12 is a table showing an example of measurement/analysis results according to the first embodiment of the present invention.

FIG. 18 is a table showing an example of measurement/analysis results according to the second embodiment of the present invention.

FIG. 20A is a table (aircraft noise) showing the types of already-known data or unknown data used in a model of each to-be-measured/analyzed target according to the first to third embodiments of the present invention.

FIG. 20B is a table (road traffic noise and road traffic vibrations) showing the types of already-known data or unknown data used in a model of each to-be-measured/analyzed target according to the first to third embodiments of the present invention.

FIG. 20C is a table (railroad noise and railroad vibrations) showing the types of already-known data or unknown data used in a model of each to-be-measured/analyzed target according to the first to third embodiments of the present invention.

FIG. 20D is a table (office/construction noise, environmental noise, and office/construction vibrations) showing the types of already-known data or unknown data used in a model of each to-be-measured/analyzed target according to the first to third embodiments of the present invention.

Figure 1:
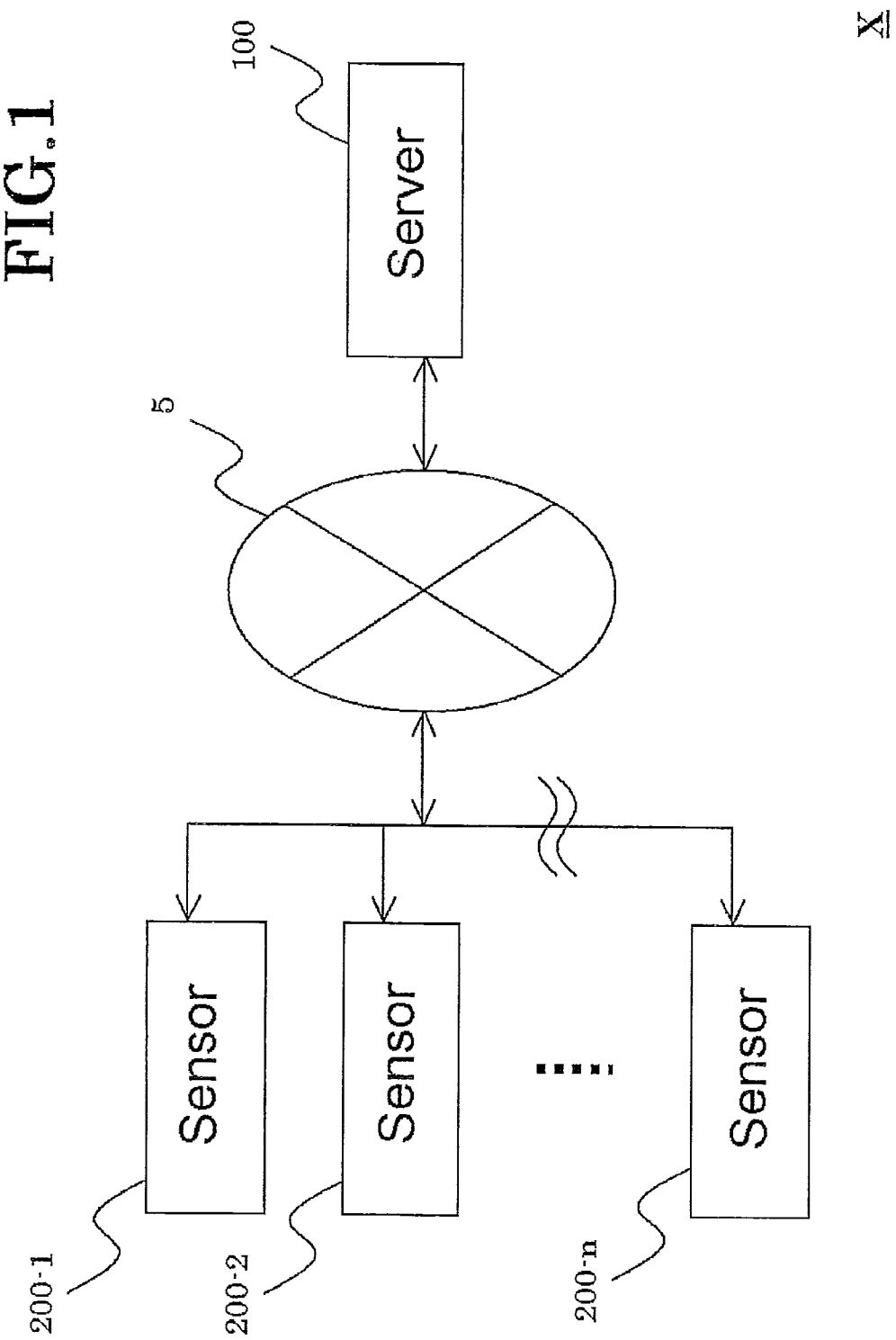
FIG. 1 is a system configuration diagram of a noise judgment system X according to a first embodiment of the present invention.
Figure 2:
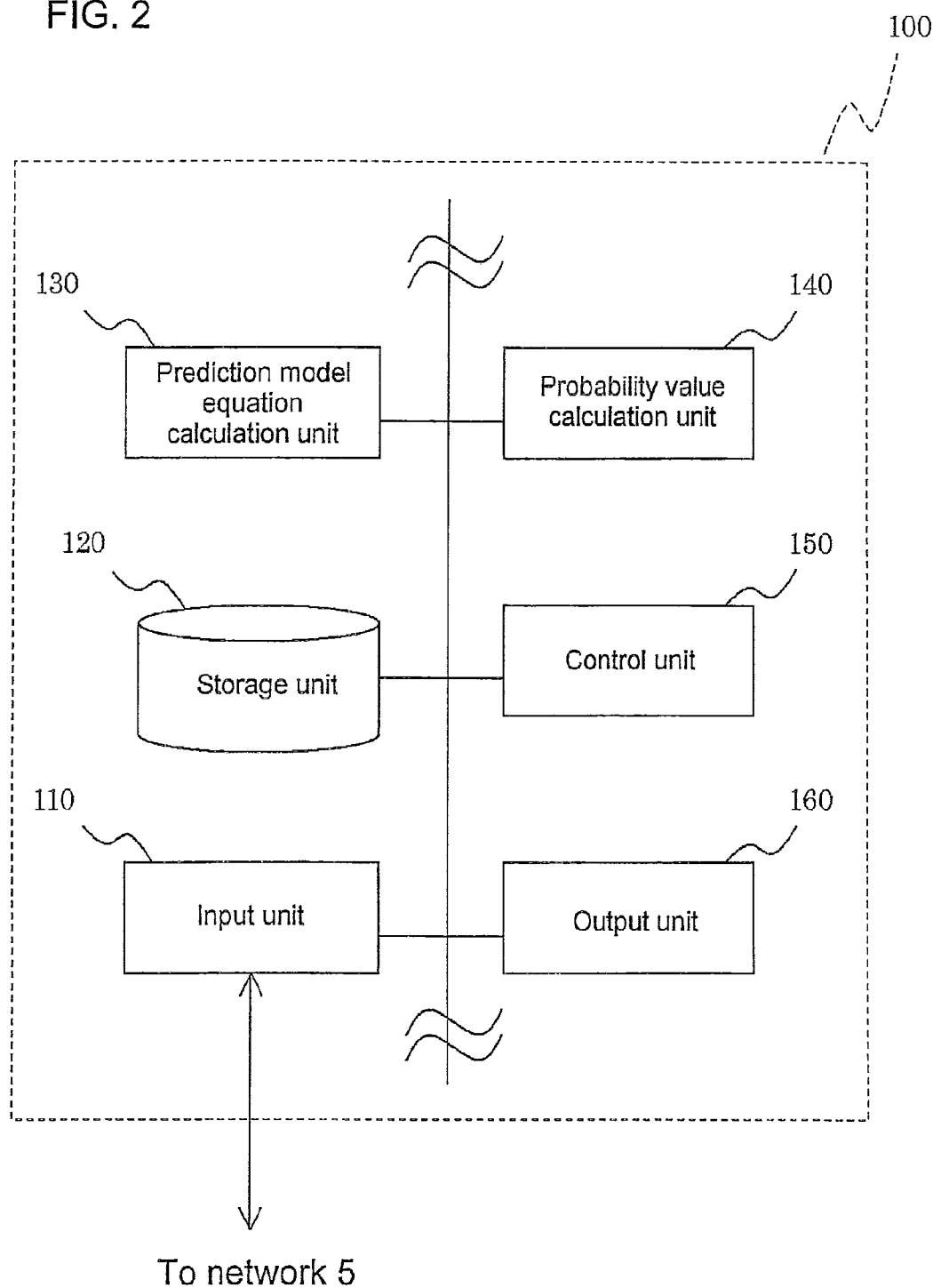
FIG. 2 is a control block diagram of a server 100 according to the first embodiment of the present invention.
Figure 4:
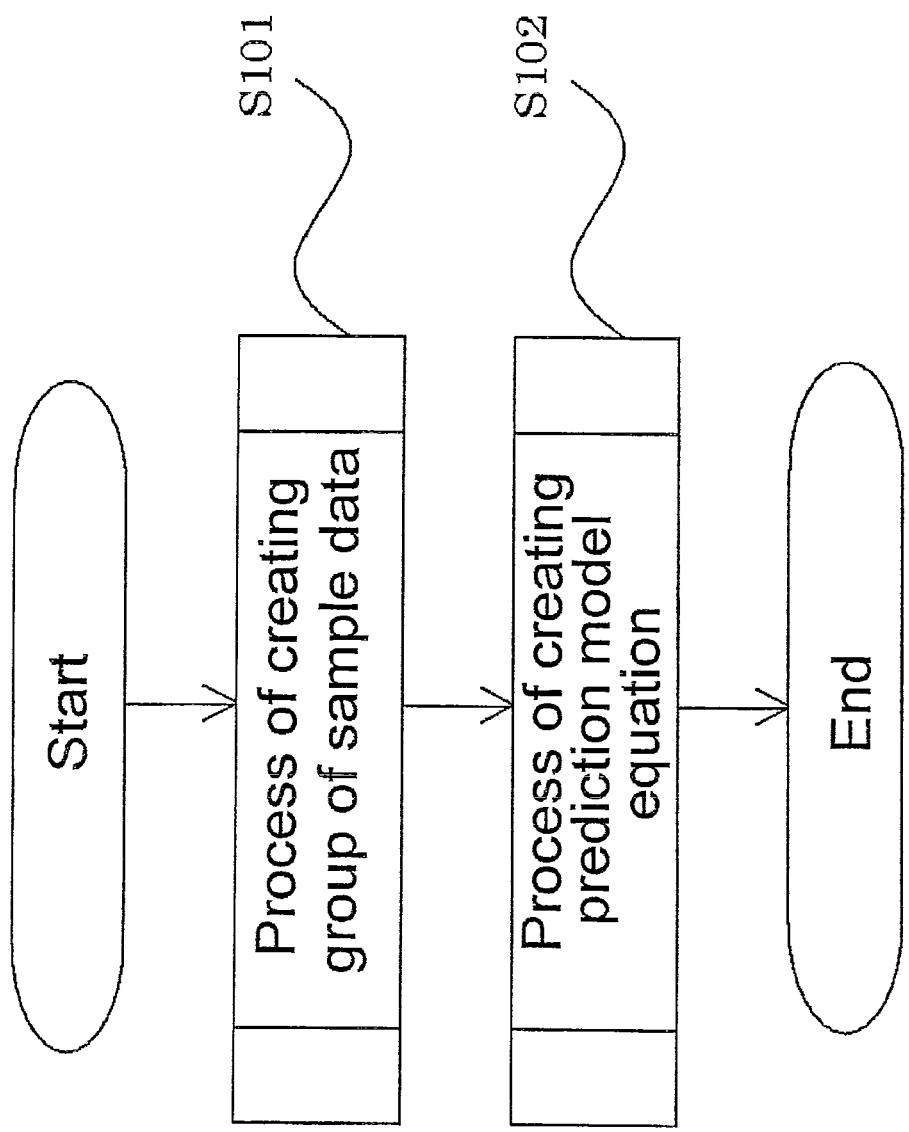
FIG. 4 is a flowchart illustrating a prediction model creation process according to the first embodiment of the present invention.
Figure 5:
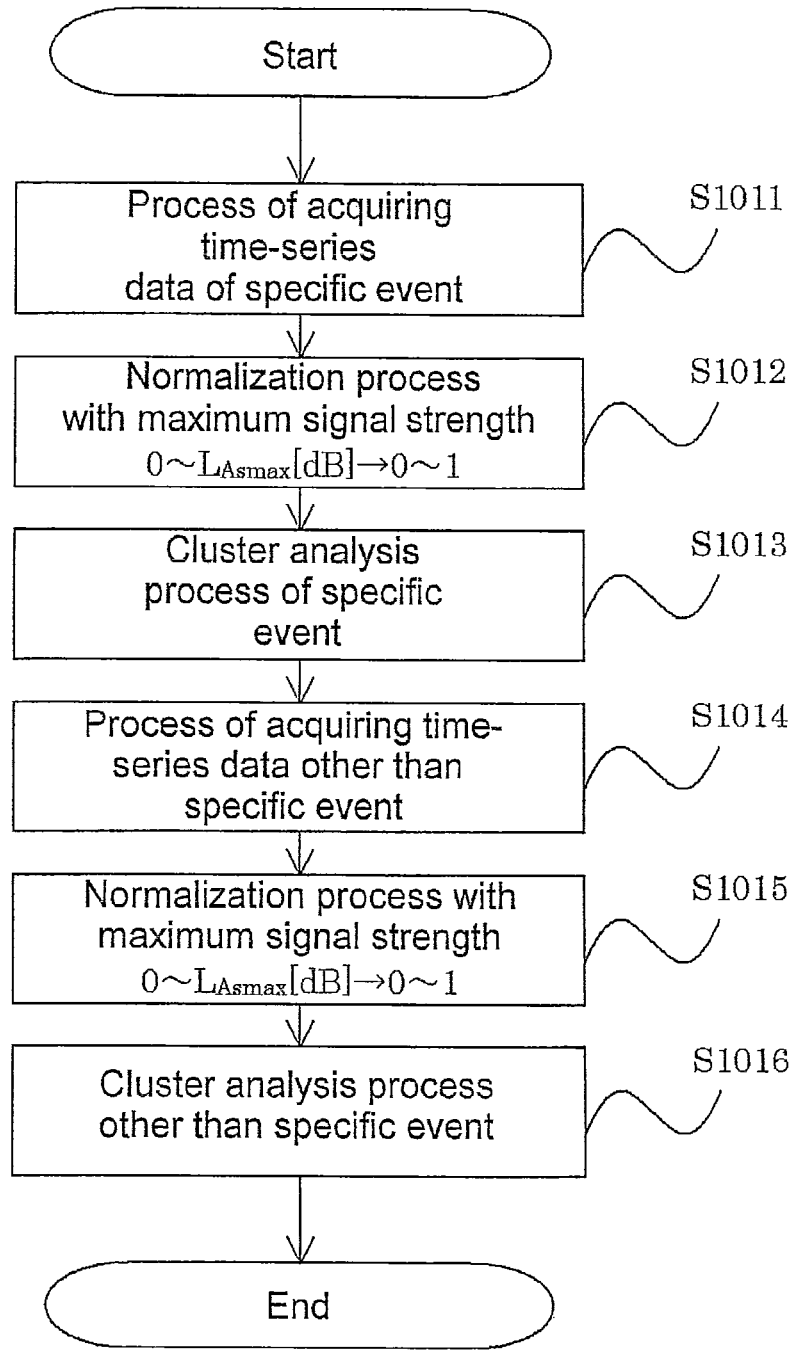
FIG. 5 is a flowchart illustrating a sample data group creation process according to the first embodiment of the present invention.
Figure 6:
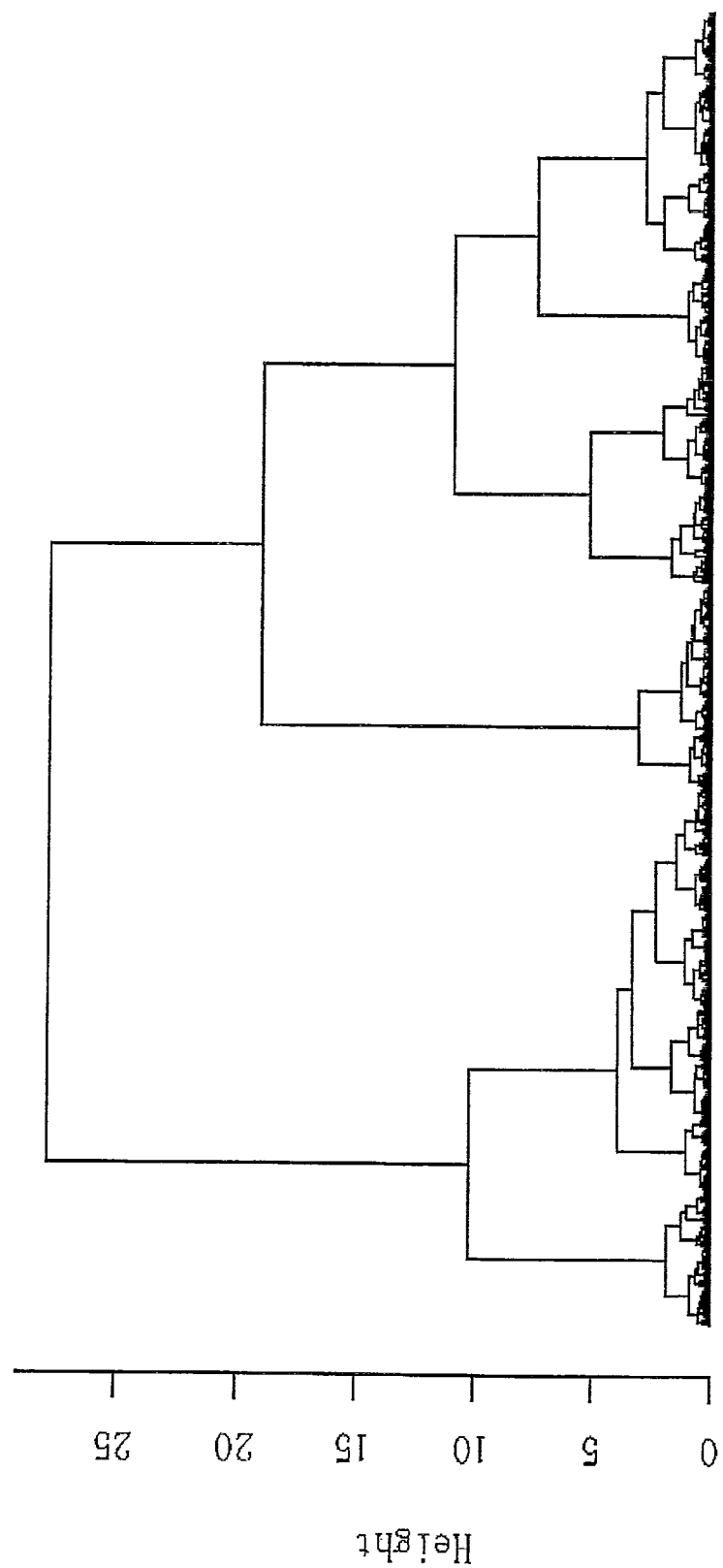
FIG. 6 is a diagram showing an example of a cluster analysis process according to the first embodiment of the present invention.
Figure 7:
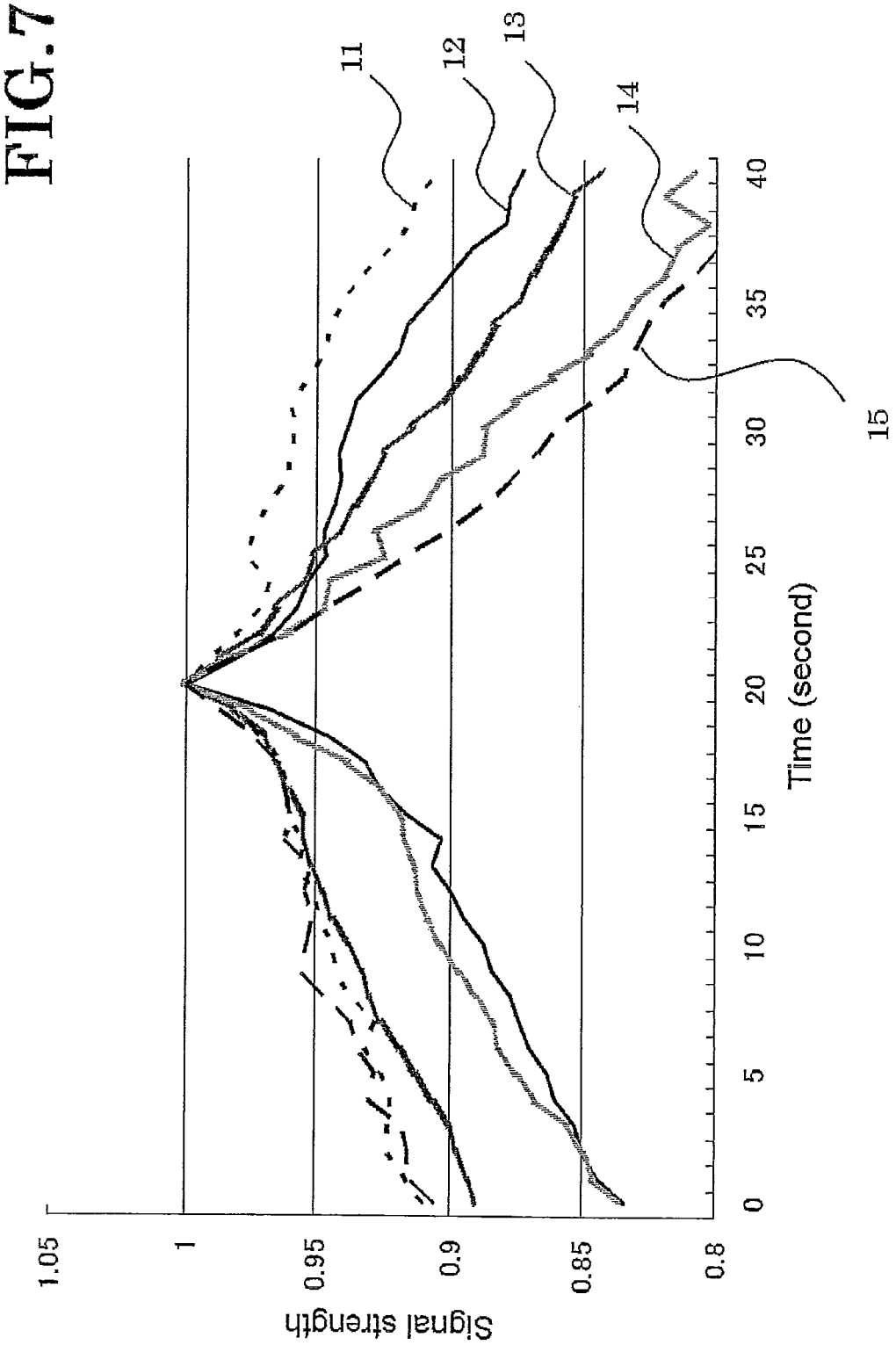
FIG. 7 is a graph of time-series data of a group of sample data other than aircraft noise according to the first embodiment of the present invention.
Figure 8:
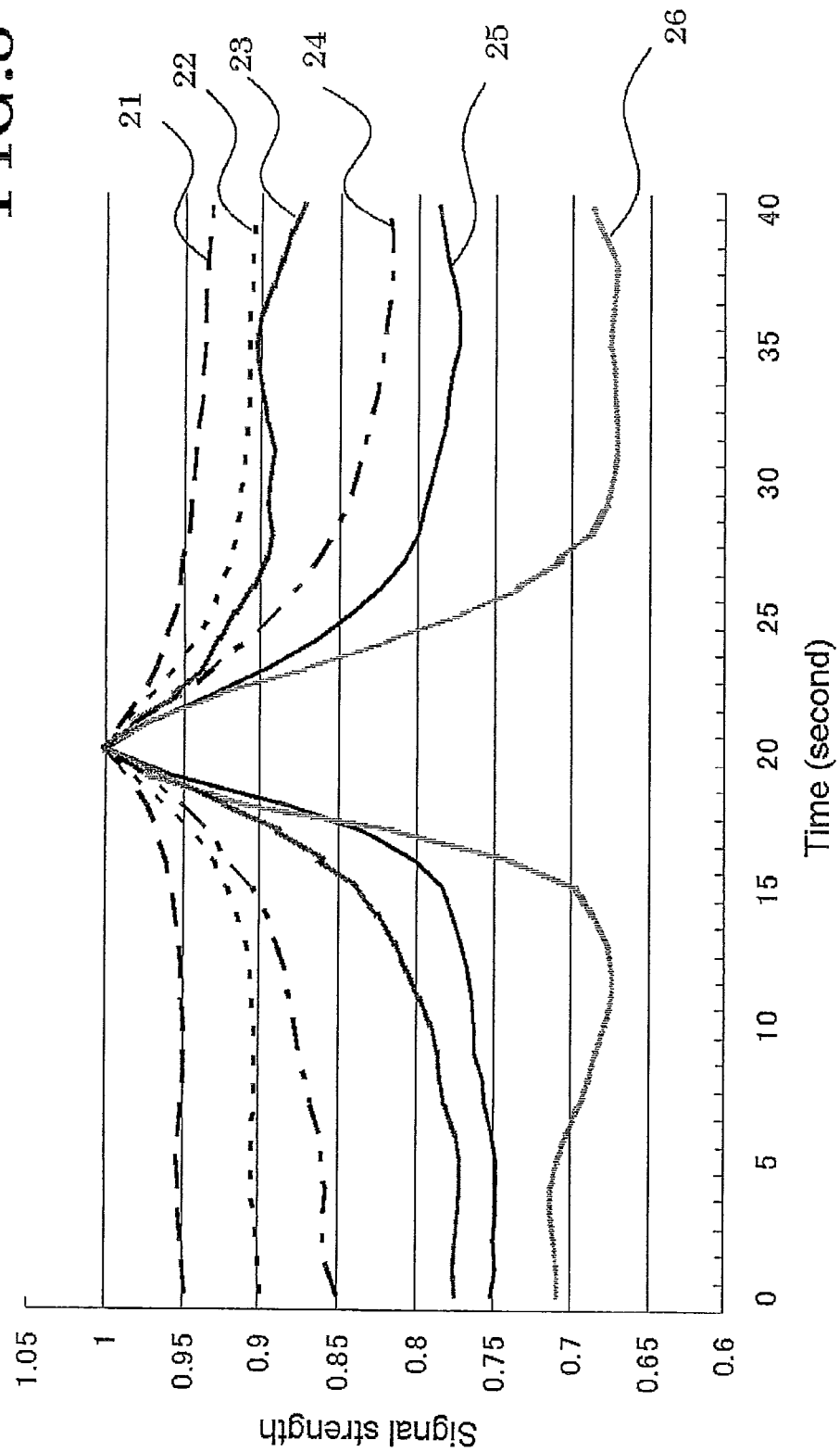
FIG. 8 is a graph of time-series data of a group of sample data other than aircraft noise according to the first embodiment of the present invention.
Figure 9:
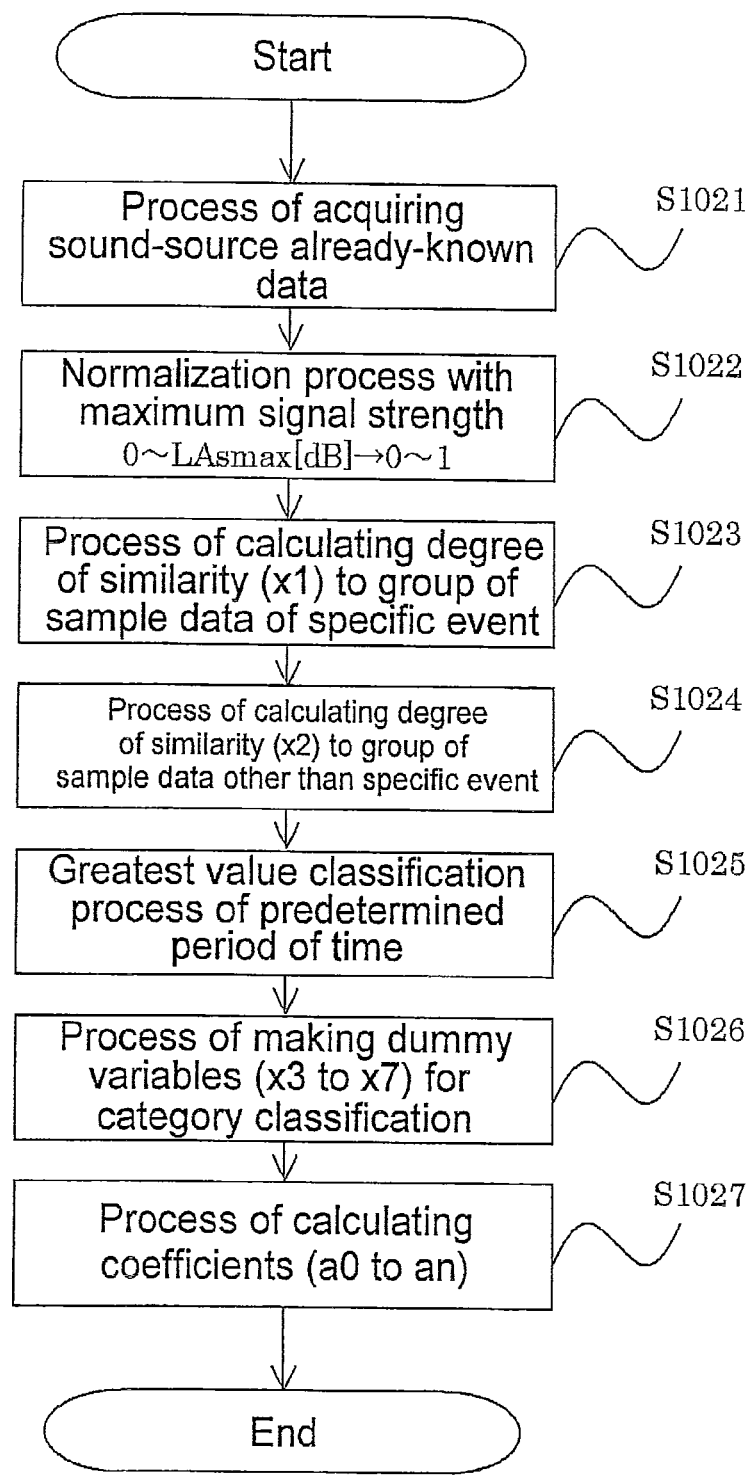
FIG. 9 is a flowchart illustrating a prediction model equation creation process according to the first embodiment of the present invention.
Figure 11:
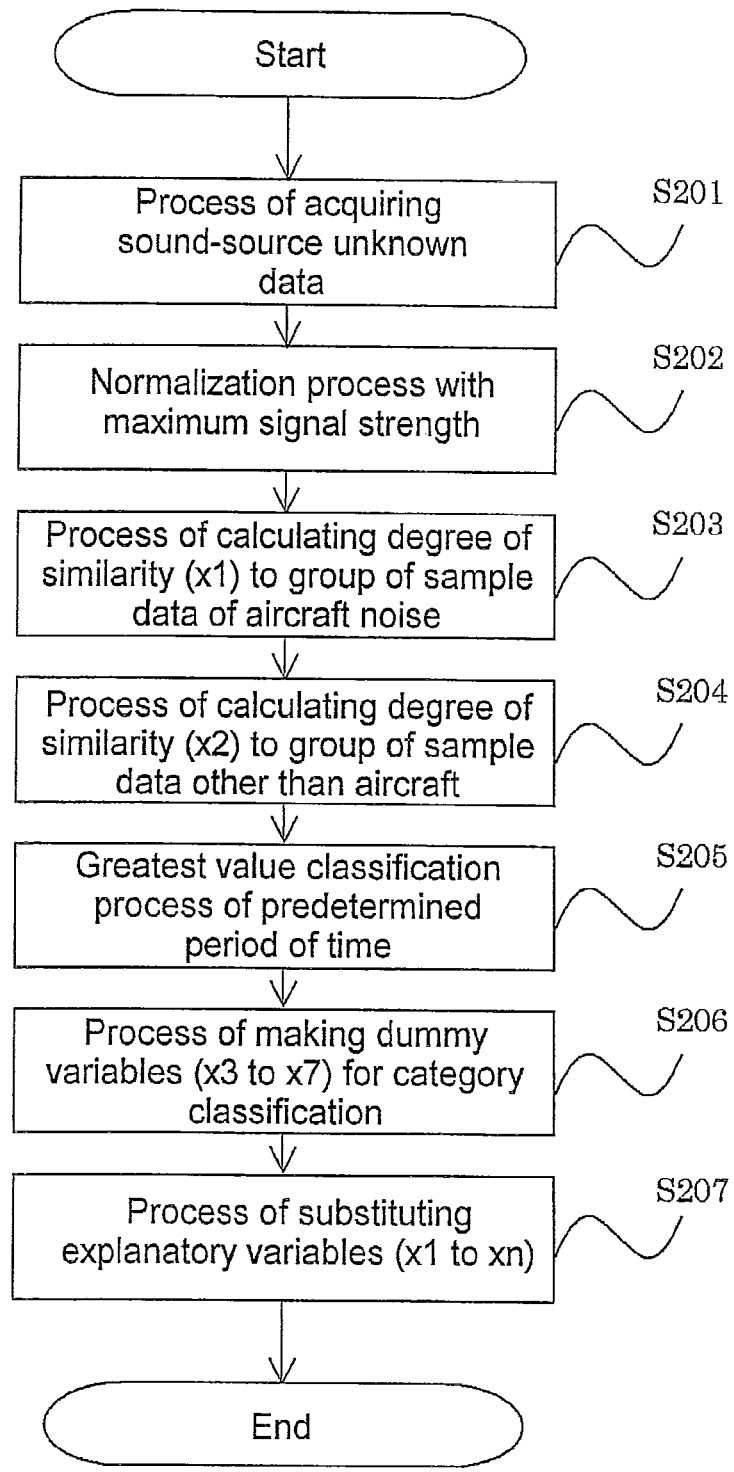
FIG. 11 is a flowchart illustrating a probability value calculation process according to the first embodiment of the present invention.
Figure 13:
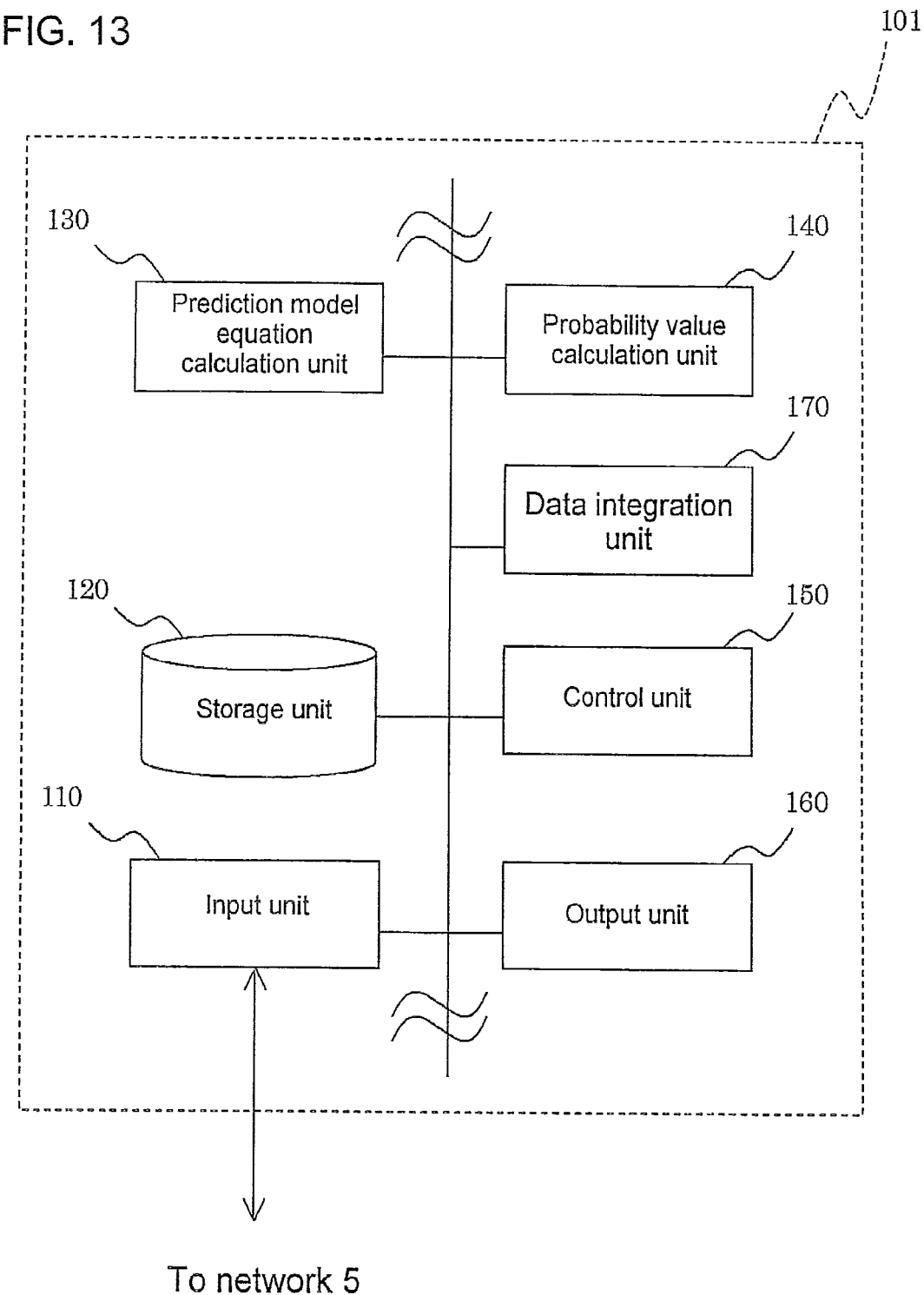
FIG. 13 is a control block diagram of a server 101 according to a second embodiment of the present invention.
Figure 14:
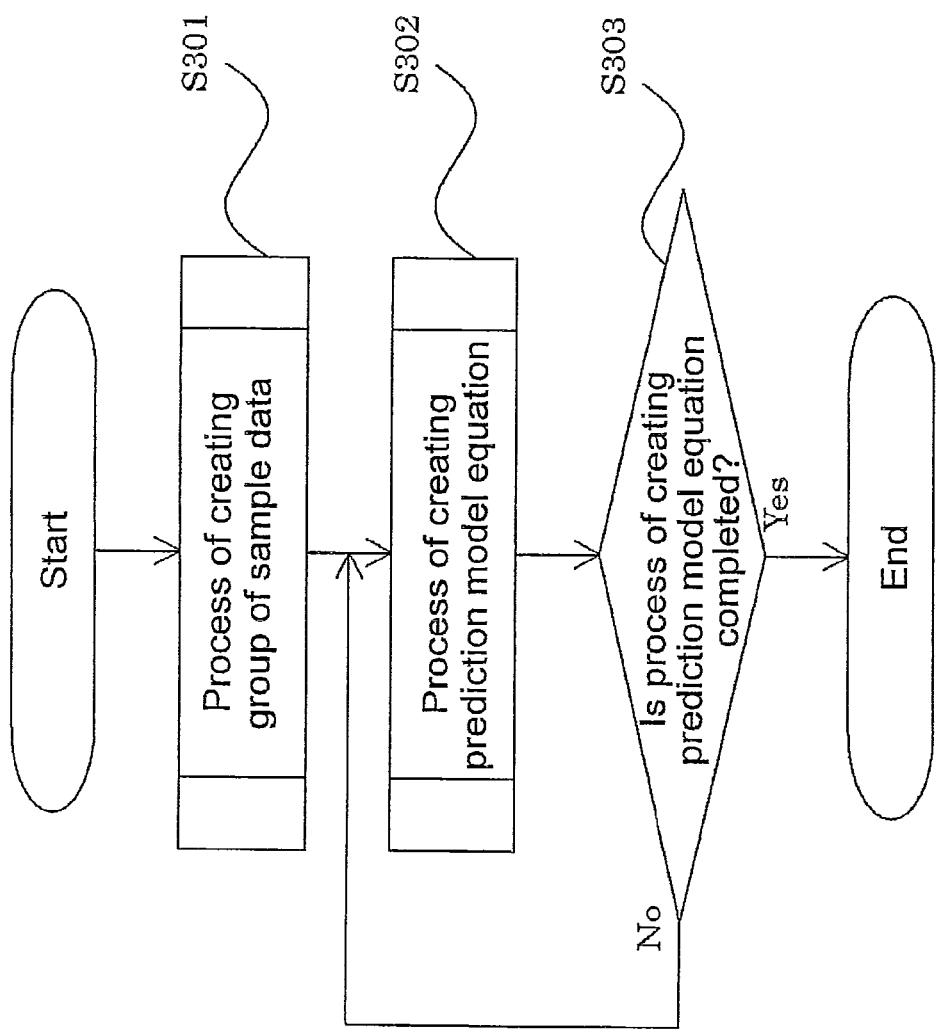
FIG. 14 is a flowchart illustrating a prediction model equation group creation process according to the second embodiment of the present invention.
Figure 15:
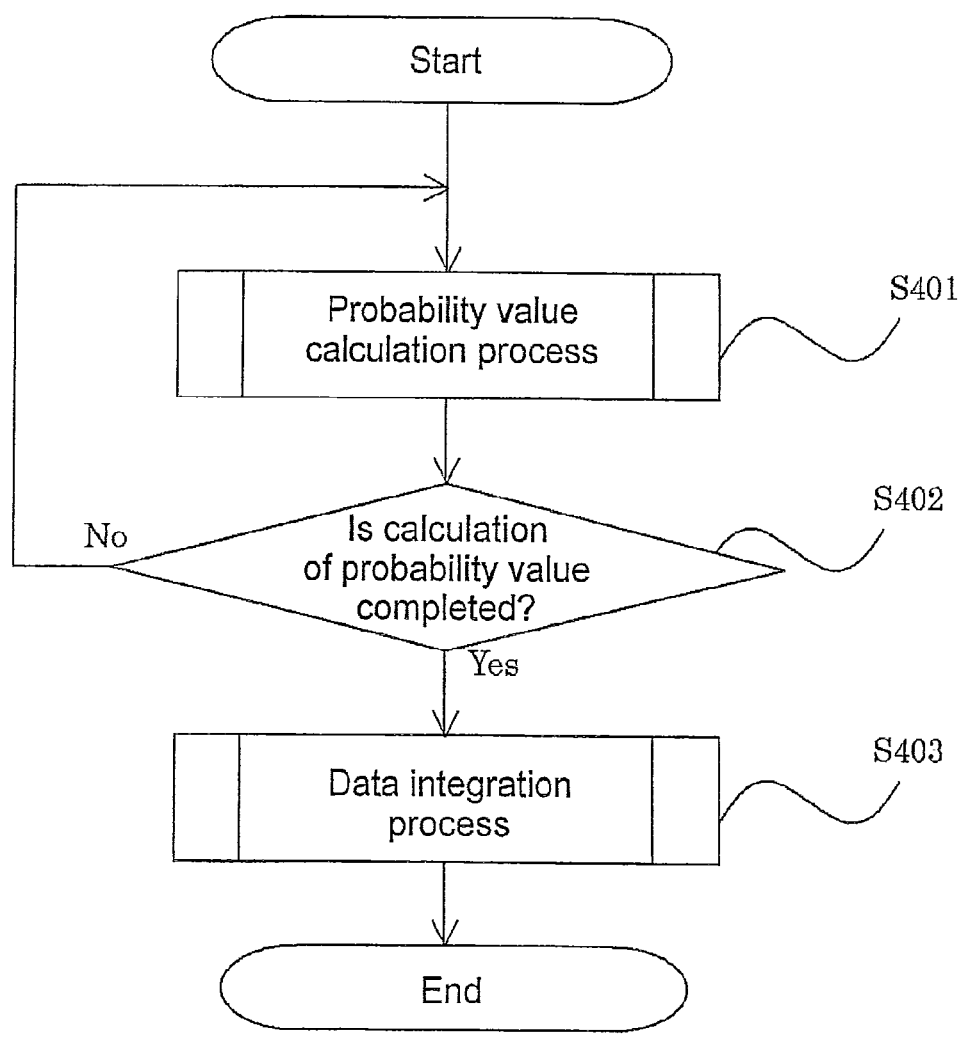
FIG. 15 is a flowchart illustrating a probability value calculation process according to the second embodiment of the present invention.
Figure 16:
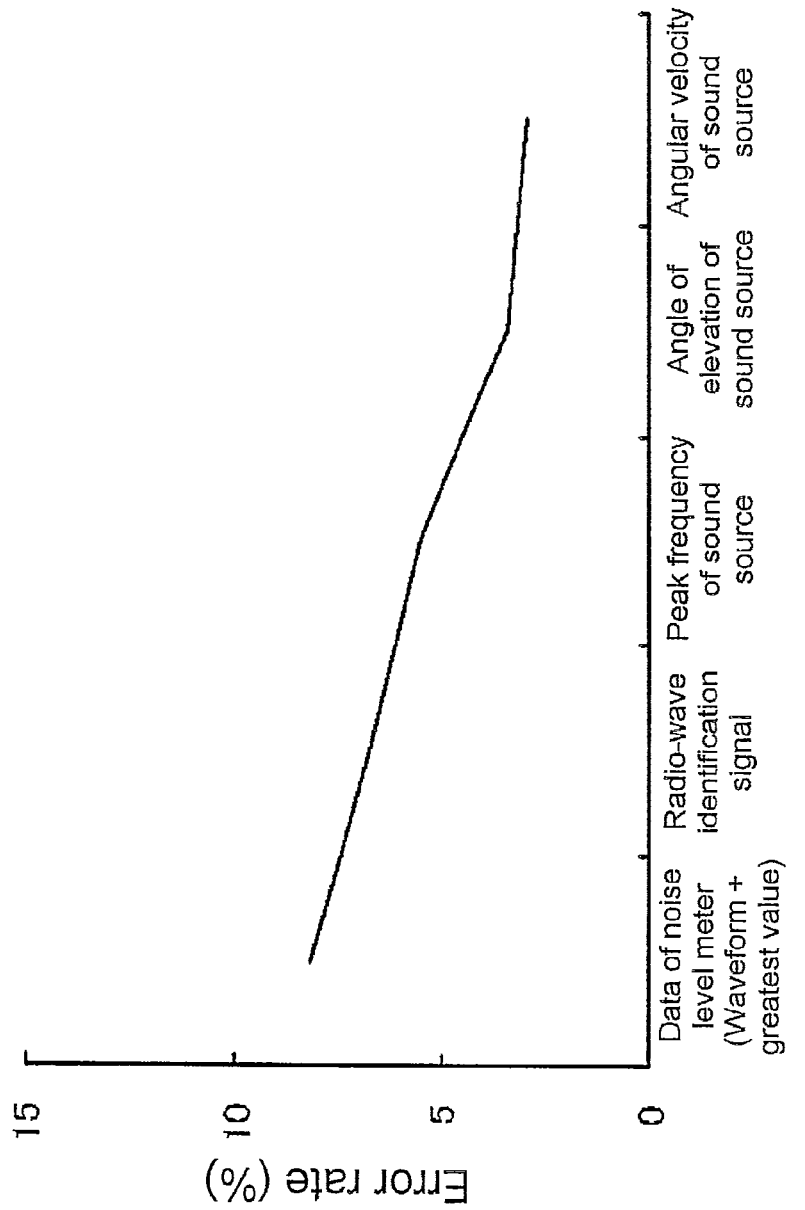
FIG. 16 is a graph showing an error rate according to the second embodiment of the present invention.
Figure 17:
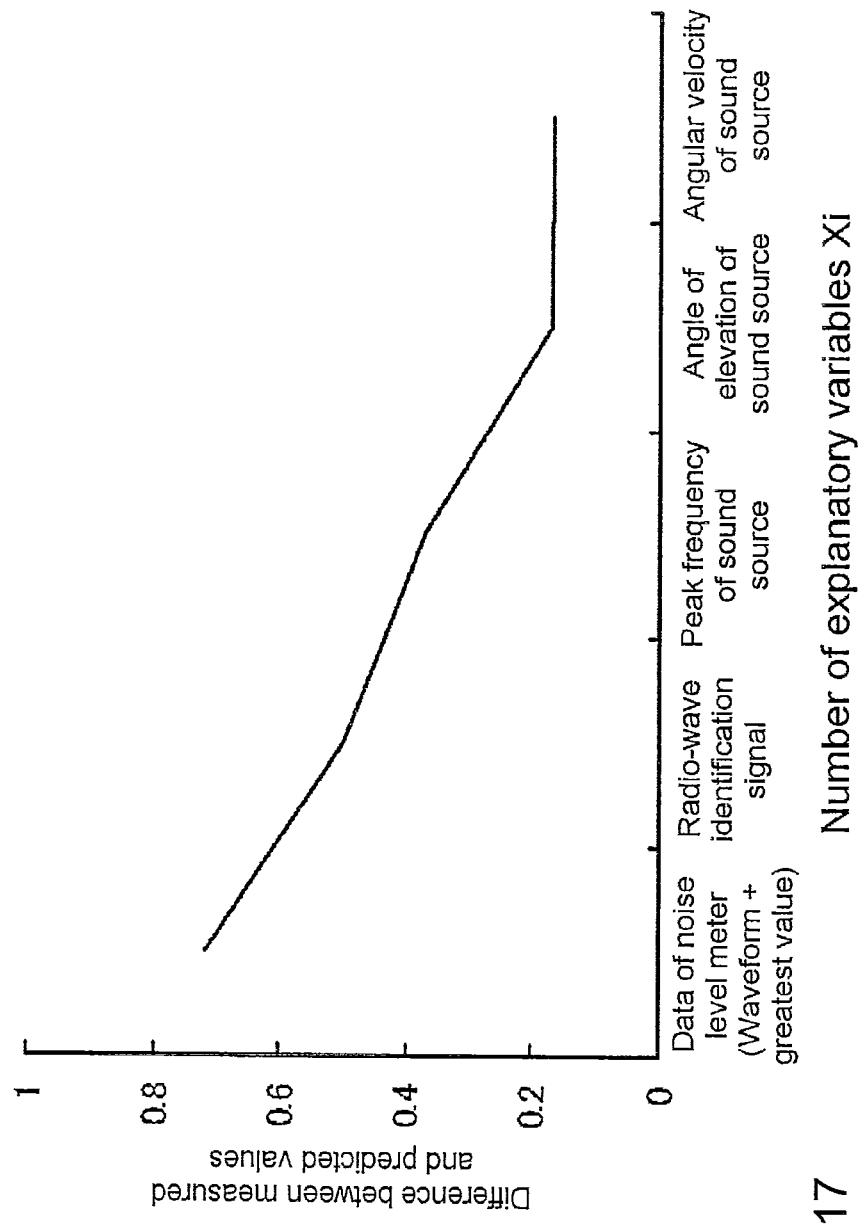
FIG. 17 is a graph showing a difference between predicted and measured values of WECPNL according to the second embodiment of the present invention.
Figure 19:
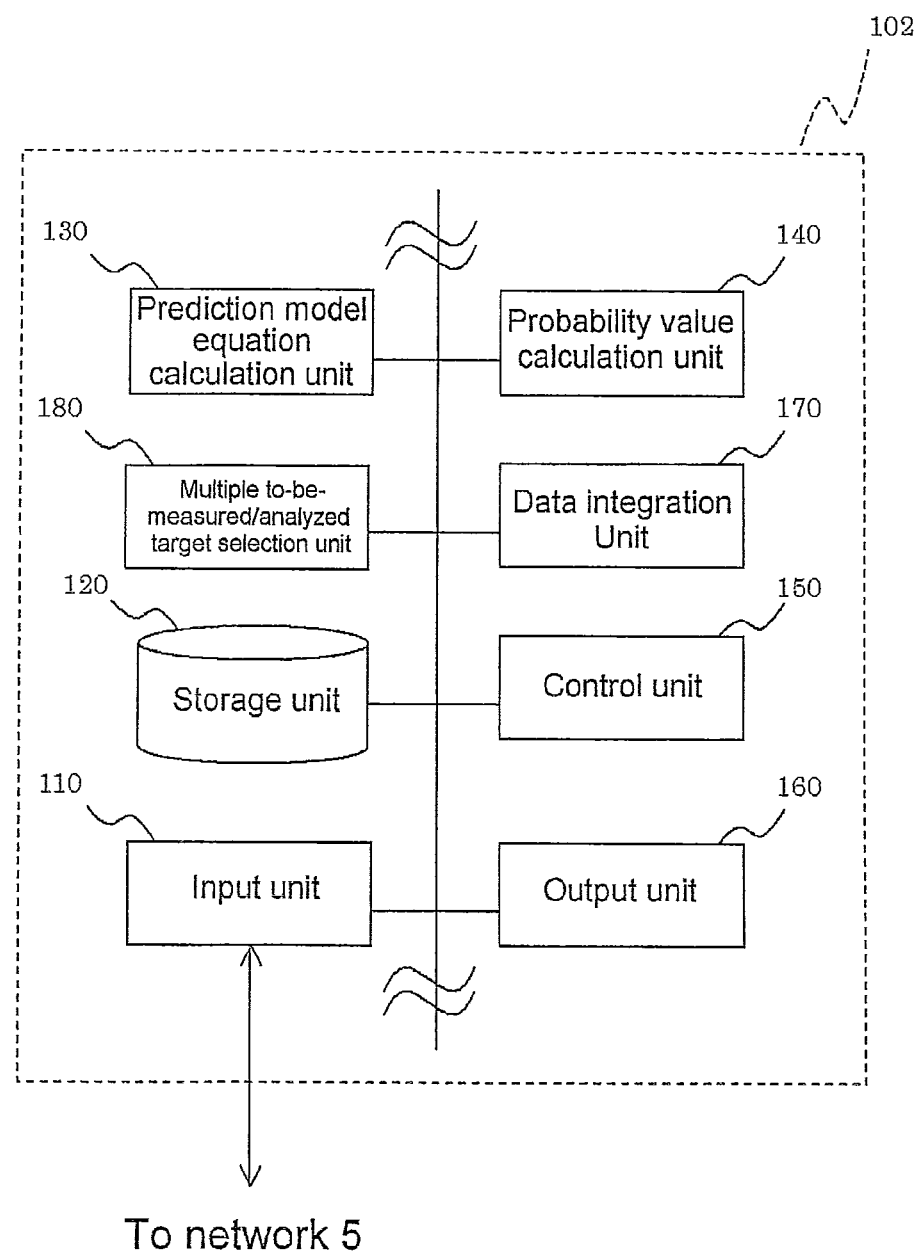
FIG. 19 is a control block diagram of a server 102 according to a third embodiment of the present invention.

| Reference Signs List | |
|---|---|
| 5: | Network |
| 11 to 15, 21 to 26: | Sample data |
| 100, 101, 102: | Server |
| 110: | Input unit |
| 120: | Storage unit |
| 130: | Prediction model equation calculation unit |
| 140: | Probability value calculation unit |
| 150: | Control unit |
| 160: | Output unit |
| 170: | Data integration unit |
| 180: | Multiple to-be-measured/analyzed target selection unit |
| 200-1 to 200-n: | Sensor |
| X: | Noise judgment system |

What is claimed is:

1. A signal judgment method that is a sound noise or vibrations judgment method of determining by a computer whether data is a signal judgment target, comprising:
inputting, into a model of a signal judgment target associated with the sound noise or vibrations, unknown data for which a type of the sound noise or vibrations is unknown; and,
obtaining an output value of the model of the signal judgment target as a probability value of whether the unknown data is a signal judgment target.

2. The signal judgment method according to claim 1, wherein
the model of the signal judgment target is created with the use of measured already-known data for which a type of the sound noise or vibrations is already known.

3. The signal judgment method according to claim 2, wherein:
the model of the signal judgment target is created by prediction model equation calculator with the use of the already-known data;
unknown data is input into the created model of the signal judgment target associated with the sound noise or vibrations; and
an output value calculated by an output value calculator that uses model of the signal judgment target is obtained as a probability value which is a prediction probability that the unknown data is a signal judgment target.

4. The signal judgment method according to claim 3, wherein
the signal judgment target is a model of a signal judgment target that uses data concerning a sound noise or vibrations of a living environment.

5. The signal judgment method according to claim 4, wherein:
a logistic regression equation is used for a prediction model equation associated with the model of the signal judgment target;
the logistic regression equation uses a prediction factor associated with the model of the signal judgment target as an explanatory variable;
the logistic regression equation uses the fact of whether the unknown data is the signal judgment target as an response variable; and
the probability value which is a prediction probability is calculated by adapting and inputting the unknown data to the logistic regression equation.

6. The signal judgment method according to claim 5, wherein
some of the explanatory variables are adapted to prediction model equation after being classified into categories.

7. The signal judgment method according to claim 6, wherein
the adaptation to the prediction model equation is made with the use of a degree of similarity between a plurality of items of the unknown data and sample data of a signal that becomes a signal judgment target, and the probability value which is a prediction probability is calculated.

8. The signal judgment method according to claim 7, wherein
the adaptation to the prediction model equation is made with the use of the degree of dissimilarity between a plurality of items of the unknown data and sample data of a signal that is not a signal judgment target, and the probability value which is a prediction probability is calculated.

9. The signal judgment method according to claim 8, wherein
data of a type that has a significant impact to an evaluation amount in case of being mistakenly determined to be a noise on a prediction model equation of the signal judgment target is used as sample data of a signal that is not a signal judgment target.

10. The signal judgment method according to claim 7, wherein
the sample data is created with the use of a statistical method from sampled time-series data of a predetermined period of time.

11. The signal judgment method according to claim 5, wherein
a model equation of a signal judgment target is created by calculating a coefficient of an explanatory variable of the logistic regression equation with the use of the already-known data.

12. The signal judgment method according to claim 5, wherein
a process of carrying out a test of a prediction model equation of the prediction model or explanatory variable and a process of carrying out an examination or test of validity are further performed.

13. The signal judgment method according to claim 5, wherein
the already-known data is accumulated, and the prediction model equation is created again on the basis of the accumulated data.

14. The signal judgment method according to claim 3, wherein
a plurality of signal judgment targets is changed, the unknown data is applied to the prediction model equation for the changed signal judgment target, and a probability value which is a prediction probability that the unknown data is the changed signal judgment target is obtained.

15. The signal judgment method according to claim 3, wherein
a plurality of the prediction model equations are provided, and, if one portion of the unknown data is not acquired, a prediction model equation that does not apply the unknown data is used among a plurality of the prediction models equations.

16. A non-transitory computer readable medium storing a program which causes a processor to perform the signal judgment method according to claim 1 when executed by the processor.

17. A signal judgment apparatus, comprising:

storage for storing a prediction equation of a model of a signal judgment target associated with a sound noise or vibrations, already-known data for which a type of the sound noise or vibrations is already known, unknown data for which a type of the sound noise or vibrations is already unknown, sample data of a signal that is to be judged, and sample data of a signal that is not to be judged;

prediction model equation calculator for creating a prediction model equation by calculating a coefficient of an explanatory variable with the use of a degree of similarity or dissimilarity between the already-known data and sample data of a signal that becomes a signal judgment target and/or sample data of a signal that is not a signal judgment target;

an input unit configured to input an input value to the storage;

an output value calculator configured to apply and calculate each value of the unknown data to the prediction model equation of a model of the signal judgment target;

an output unit configured to output the output value; and a judgment unit configured to measure and/or analyze a type of the unknown data by using the output value.

18. The signal judgment apparatus according to claim 17, wherein:

the storage is a storage in which a plurality of the prediction model equations is stored when the explanatory variable is added;

the signal judgment apparatus further includes a data integrator configured to integrate output values of a plurality of the prediction model equations; and the output value calculator applies data concerning the explanatory variable to a plurality of the prediction model equations by the integrator for calculation.

19. A signal judgment apparatus, comprising:

the signal judgment apparatus claimed in claim 17 or 18; and a sensor that transmits the unknown data to the input unit.

* * * * *